United States Patent
Takigawa et al.

(10) Patent No.: US 10,985,522 B2
(45) Date of Patent: Apr. 20, 2021

(54) LASER APPARATUS

(71) Applicant: Fanuc Corporation, Yamanashi (JP)

(72) Inventors: Hiroshi Takigawa, Yamanashi (JP); Ryusuke Miyata, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 77 days.

(21) Appl. No.: 16/533,077

(22) Filed: Aug. 6, 2019

(65) Prior Publication Data

US 2020/0052456 A1    Feb. 13, 2020

(30) Foreign Application Priority Data

Aug. 8, 2018  (JP) .............................. JP2018-149599

(51) Int. Cl.

| H01S 3/13 | (2006.01) |
|---|---|
| G02B 6/02 | (2006.01) |
| H01S 3/131 | (2006.01) |
| H01S 3/00 | (2006.01) |
| H01S 3/067 | (2006.01) |
| G02B 6/26 | (2006.01) |

(52) U.S. Cl.
CPC .............. *H01S 3/1305* (2013.01); *G02B 6/02* (2013.01); *G02B 6/26* (2013.01); *H01S 3/0014* (2013.01); *H01S 3/06754* (2013.01); *H01S 3/1317* (2013.01)

(58) Field of Classification Search
CPC ..... H01S 3/1305; H01S 3/1317; H01S 3/0014
See application file for complete search history.

(56) References Cited

U.S. PATENT DOCUMENTS

| 5,059,760 A | 10/1991 | Iehisa et al. |
| 2014/0144895 A1 | 5/2014 | Stork Genannt Wersborg et al. |
| 2017/0110847 A1* | 4/2017 | Kajiwara .............. H01S 3/1306 |
| 2018/0138654 A1* | 5/2018 | Chiba .................. H01S 3/1305 |
| 2019/0213479 A1 | 7/2019 | Takigawa et al. |

FOREIGN PATENT DOCUMENTS

| JP | 02179374 A | 7/1990 |
| JP | 11277274 A | 10/1999 |
| JP | 2005007428 A | 1/2005 |

(Continued)

OTHER PUBLICATIONS

Japanese Decision to Grant a Patent for Japanese Application No. 2018-149599, dated Jun. 25, 2020 with translation, 5 pages.

*Primary Examiner* — Michael Carter
(74) *Attorney, Agent, or Firm* — RatnerPrestia

(57) ABSTRACT

A laser apparatus calculates a temperature of a temperature increase portion that is raised in temperature by reflection light, and determines and outputs an emergency optical output command with the aim of ensuring that the calculated temperature does not exceed a first predetermined temperature, which is set at a lower temperature than an upper limit heat resistance temperature, and if necessary, controlling the temperature to or below a second predetermined temperature set at a lower temperature than the first predetermined temperature. When the emergency optical output command is to be output, a control unit switches an optical output command output thereby to the emergency optical output command and outputs the emergency optical output command.

16 Claims, 20 Drawing Sheets

(56) References Cited

FOREIGN PATENT DOCUMENTS

| | | |
|---|---|---|
| JP | 2007042981 A | 2/2007 |
| JP | 2013173176 A | 9/2013 |
| JP | 2014034034 A | 2/2014 |
| JP | 2018082045 A | 5/2018 |
| JP | 2019118940 A | 7/2019 |
| WO | 2016002947 A1 | 1/2016 |

* cited by examiner

LASER APPARATUS

RELATED APPLICATIONS

The present application claims priority to Japanese Patent Application Number 2018-149599 filed Aug. 8, 2018, the disclosure of which is hereby incorporated by reference herein in its entirety.

BACKGROUND OF THE INVENTION

1. Field of the Invention

The present invention relates to a laser apparatus that irradiates a workpiece serving as a laser machining subject with laser light emitted from a laser oscillator via a laser optical system such as an optical fiber or a machining head, wherein, in order to prevent damage due to temperature increases in respective parts of the laser optical system and the laser apparatus caused by reflection light (or return light) propagating in a substantially opposite direction to the laser light emitted from the laser oscillator, laser light output is controlled on the basis of calculation results relating to the temperature increases in the respective parts caused by the reflection light.

2. Description of the Related Art

A problem occurring primarily in a high power laser apparatus used as a laser cutting machine for sheet metal cutting or welding, and particularly in a high power fiber laser apparatus, is that when laser light output from a machining head is reflected by the surface of a laser machining subject or a transmission window of the machining head so as to return into a laser optical system or the laser apparatus, principal parts of a laser oscillator or the laser optical system, such as optical fibers, an optical fiber connector, or an excitation laser diode module, are damaged.

In laser apparatuses, preventing damage to the laser oscillator and the laser optical system caused by reflection light is an important problem, and therefore various techniques relating thereto have been proposed. For example, Japanese Patent Application Laid-Open No. 2007-042981 discloses an optical fiber laser having at least a rare earth-doped optical fiber serving as a laser medium, a plurality of excitation light sources for optically exciting the rare earth-doped optical fiber, and an optical coupler for combining excitation light from the respective excitation light sources and inputting the combined excitation light into the rare earth-doped optical fiber, wherein the optical fiber laser executes laser oscillation by inputting the excitation light into the rare earth-doped optical fiber. The optical coupler is provided with a monitoring port through which a part of return light traveling from the rare earth-doped optical fiber toward the excitation light source side propagates, and excitation light source control means for measuring the intensity of the return light propagating through the monitoring port and preventing amplification of the return light by reducing the output of the excitation light sources when the optical intensity exceeds a predetermined value.

Japanese Patent Application Laid-Open No. 2014-034034 discloses a laser machining apparatus in which a laser oscillator and a laser machining head are connected by an optical fiber, the laser machining apparatus including return light detecting means for detecting return light generated when laser light emitted onto a workpiece returns to the optical fiber, digital processing means for digitally processing a detection value of the return light, moving average processing means for calculating the moving average of a digital signal generated in the digital processing, comparing means for comparing a processed value processed by the moving average processing means with preset alarm and warning thresholds, and processing means for executing alarm processing or warning processing in accordance with the result of the comparison by the comparing means. Further, during the alarm processing, measures such as halting laser oscillation and halting laser machining, for example, are implemented in accordance with the intensity of the return light.

WO 2016/002947 discloses an optical fiber laser apparatus that generates laser light using an amplifying optical fiber as an amplification medium of a laser oscillator, the optical fiber laser apparatus including an output optical fiber for emitting the laser light to the outside, a return light attenuation unit for executing attenuation processing on return light propagating through at least the output optical fiber in an opposite direction to the laser light, heat conversion means provided in the return light attenuation unit to convert the return light into heat, temperature monitoring means for measuring a temperature increase in the return light attenuation unit caused by the heat generated by the heat conversion means, and a control unit that reduces or stops output of the laser light when the temperature measured by the temperature monitoring means equals or exceeds a predetermined threshold.

In the technique disclosed in Japanese Patent Application Laid-Open No. 2007-042981, however, control is not executed on the basis of temperature increases in respective parts in which temperature increases caused by the reflection light are problematic, and therefore this technique cannot be considered an appropriate control method. More specifically, to ensure that the laser apparatus is not damaged even when the return light intensity exceeds a predetermined value continuously for a certain period of time, the predetermined value must be set rather low. If the return light intensity exceeds the predetermined value even momentarily, however, the output of the excitation light sources is reduced to prevent amplification of the return light even though the laser apparatus is unlikely to be damaged thereby, leading to machining defects and a reduction in the operation rate of the laser apparatus or the machining efficiency of the laser machining.

With the technique disclosed in Japanese Patent Application Laid-Open No. 2014-034034, meanwhile, the detection value of the return light is subjected to moving average processing by the moving average processing means, and it is therefore possible to avoid the problem of the laser machining being stopped when return light exhibiting a small momentary increase is detected. When the damage caused by the return light is due to temperature increases in respective parts, however, whether or not the temperature was raised by the return light a short time ago is not taken into account if the moving average time is short, and therefore, to avoid the risk of damage, an excessive margin must be set, meaning that appropriate condition setting cannot be achieved. Conversely, if the moving average time is long, reductions in the temperatures of the temperature increase portions due to heat dissipation occurring within the moving average time are not taken into account, and therefore a situation in which the moving average of the detection value of the return light exceeds the predetermined value such that the laser cutting is stopped even though the temperatures of the temperature increase portions have not actually increased to a degree that is problematic may arise. Also in this case, therefore, appropriate condition setting cannot be achieved.

Instead of reducing or stopping the laser light output in accordance with the peak value or the moving average value of the detection value of the reflection light (the return light) detected by the light detecting means, as described above, the laser light output may be reduced or stopped in accordance with the number of times the peak value of the detection value exceeds the predetermined value, the time during which the peak value of detection value exceeds the predetermined value, or the amount of heat generated each time a single pulse is output. However, these techniques all relate to essentially identical control methods to those of the prior art described above and are not techniques with which the laser light output can be controlled appropriately at all times in response to reflection light that varies at high speed and in a number of different ways over time.

Furthermore, WO 2016/002947 discloses a technique in which the laser light output is reduced or stopped when the temperature measured by the temperature measuring means, which measures the temperature increase in the return light attenuation unit caused by the heat generated by the heat conversion means for converting the return light into heat, reaches or exceeds a predetermined threshold. However, although measuring the actual temperature increase caused by the return light and outputting laser light on the basis of the measurement result is an effective method, when an attempt is made to provide temperature detecting means capable of detecting the temperatures of all of the parts in which a temperature increase caused by return light is problematic, to monitor the temperature increases therein, and to execute control on the basis of the temperature increases so as to reduce the reflection light when the temperature in any one of these parts reaches a predetermined temperature, the cost and size of the laser apparatus increase, meaning that this method is not realistic.

The conventional laser apparatuses described above are provided with detecting means for detecting return light in order to prevent damage to the laser apparatus caused by the return light, and when the peak value of the light quantity of the detected reflection light exceeds a predetermined value or the time moving average value of the detection value of the detected reflection light exceeds a predetermined value, laser light output is stopped or reduced. However, at least the majority of the damage inflicted on the laser apparatus by the return light is damage due to increases in the temperatures of the respective parts of the laser apparatuses caused by the return light, and since the laser light output is not controlled on the basis of the temperatures of the respective parts and neither heat accumulation in the respective parts due to the return light nor heat dissipation from the respective parts following increases in the temperatures of the respective parts is taken into account, condition setting is not realized appropriately. As a result, depending on the variation state of the return light, an excessive margin may be set such that laser light output is stopped or reduced unnecessarily, leading to machining defects and a reduction in the efficiency of the laser machining. In cases where it is necessary to reduce the laser light output, meanwhile, the laser light output may not be reduced, and as a result, the laser apparatus or laser optical system may be damaged.

Furthermore, although a technique in which the temperature of the part that increases in temperature due to the return light is measured and the laser light output is reduced or stopped when the measured temperature reaches or exceeds a predetermined threshold has been disclosed, the parts that may be damaged by a temperature increase caused by the return light differ in terms of their thermal capacities and thermal resistances up to a heat dissipation point, and therefore the temperatures of these parts vary in different ways. However, measuring the temperatures of all of the parts that may be damaged by a temperature increase leads to increases in the cost and size of the laser apparatus, and therefore this technique cannot be employed in a mass-produced machine.

SUMMARY OF THE INVENTION

In consideration of the circumstances described above, an object of the present invention is to provide a high-performance, reliable laser apparatus with which laser light output can be controlled in response to reflection light that varies at high speed and in various different ways over time using an appropriate margin at all times so that the laser light output is not reduced unnecessarily and the apparatus is not damaged by the reflection light by calculating a temperature increase in at least one of respective parts that may be damaged by a temperature increase caused by return light using a detection result including reflection light detected by light detecting means instead of measuring the temperature of this part, and controlling the laser light output in accordance with the calculation result.

The present invention relates to a laser apparatus in which laser light output is controlled by calculating the temperatures of respective temperature increase portions of the laser apparatus, the temperatures of which are increased by reflection light, rather than directly measuring the temperatures of the respective temperature increase portions, and, while referring to the calculated temperatures of the respective temperature increase portions, switching an optical output command to an emergency optical output command when the temperatures of the respective temperature increase portions are about to exceed a predetermined temperature so that the temperatures of the respective temperature increase portions do not exceed the predetermined temperature. Further, the present invention relates to a laser apparatus that learns, by machine learning, i.e. without human intervention, physical quantities required to calculate the temperatures of the respective temperature increase portions, such as the thermal capacities and thermal resistances of the respective temperature increase portions, and also learns an emergency optical output command to which a previously set optical output command is switched when the temperatures of the respective temperature increase portions are about to exceed a predetermined temperature.

Note that in this specification, the term "reflection light" does not invariably indicate light that has been reflected by something, and also includes radiant light emitted when the laser cutting subject is heated and so on. In other words, the term "reflection light" is used with the same meaning as the term "return light" denoting any light that propagates through a laser optical system or a laser apparatus in a substantially opposite direction to laser light emitted from a laser oscillator. Further, as regards terminology used to express the magnitude of the reflection light, other than in parts describing the prior art, terminology expressing the light quantity (of the reflection light) has been used instead of terminology expressing the intensity, i.e. the magnitude per unit surface area.

A laser apparatus according to one aspect of the present invention has at least one laser oscillator, a power supply unit for supplying a driving current to the laser oscillator, a laser optical system that includes a machining head for irradiating a workpiece serving as a laser machining subject with laser light emitted from the laser oscillator through an optical fiber, at least one light detecting unit capable of detecting the laser light emitted from the laser oscillator and reflection light propagating in a substantially opposite direction to the laser light, and a control unit that outputs an optical output command and a current output command corresponding to the optical output command to the power supply unit. The laser apparatus further includes a temperature calculation unit that is provided either inside the laser apparatus or outside the laser apparatus and uses a detection result acquired by the light detecting unit to calculate the temperature of at least one of respective temperature increase portions of the laser apparatus, which increase in temperature in response to the reflection light, and an emergency command determination unit that refers to the calculated temperature of the temperature increase portion, calculated by the temperature calculation unit, and to ensure that the temperature of the temperature increase portion does not exceed a first predetermined temperature, which is an allowable upper limit temperature of the temperature increase portion and is set at a lower temperature than an upper limit heat resistance temperature of the temperature increase portion using the upper limit heat resistance temperature as a reference, determines and outputs, as required, an emergency optical output command with the aim of controlling the temperature of the temperature increase portion either to a second predetermined temperature, which is a control target temperature of the temperature increase portion and is set at a lower temperature than the first predetermined temperature, or to a lower temperature than the second predetermined temperature. When the emergency optical output command is output, the control unit switches the optical output command output thereby to the emergency optical output command and outputs the emergency optical output command.

The laser apparatus configured as described above calculates the temperature of the temperature increase portion, which is damaged at least by reflection light, and adjusts the optical output command (controls the light output) by referring to the calculation result. Hence, in contrast to conventional light output control, which is performed in response to the detection value of the reflection light (i.e. a control method in which the light output is stopped or the light output is reduced by shortening the pulse width time width or reducing the duty when the peak value of the detection value of the reflection light exceeds a predetermined value, the peak value of the detection value of the reflection light exceeds the predetermined value more than a predetermined number of times, the detection value of the reflection light exceeds the predetermined value for longer than a predetermined time, or the average value of the detection value of the reflection light per predetermined time exceeds a predetermined value), a rational and appropriate margin can be set with respect to the reflection light, enabling improvements in both the operation rate and the reliability of the laser apparatus.

The temperature calculation unit may calculate the temperature of one of the temperature increase portions from an energy conservation formula, in which a value acquired by subtracting a time integral of an amount of heat flowing out of the temperature increase portion from a time integral of an amount of heat flowing into the temperature increase portion matches energy that has accumulated in the temperature increase portion, or from a formula obtained by modifying the energy conservation formula.

In the laser apparatus configured as described above, the temperature increase generated in each temperature increase portion by the reflection light, the light quantity of which varies in a number of ways over time, is determined from an energy conservation formula, and therefore the temperature increases in a plurality of locations that may increase in temperature due to the reflection light can be calculated logically. As a result, a rational and appropriate margin can be set.

The temperature calculation unit may calculate the temperature of the temperature increase portion as a general solution of a differential equation obtained by time-differentiating an energy conservation formula in which the value acquired by subtracting the time integral of the amount of heat flowing out of the temperature increase portion from the time integral of the amount of heat flowing into the temperature increase portion matches the energy that has accumulated in the temperature increase portion.

In the laser apparatus configured as described above, the temperature of each temperature increase portion can be calculated as a general solution of a differential equation, without using a numerical analysis method such as a finite element method, and can therefore be calculated at high speed. As a result, a situation in which output of the optical output command or control of the light output is delayed such that the laser apparatus is damaged can be prevented.

A heat inflow amount formula, which includes the detection value acquired by the light detecting unit as a function and from which the amount of heat flowing into the temperature increase portion can be calculated, may be recorded in the temperature calculation unit.

In the laser apparatus configured as described above, the amount of heat flowing into each temperature increase portion can be calculated quickly using a formula such as a polynomial determined by experiment or the like in advance, with which the heat inflow amount flowing into the temperature increase portion can be calculated, the formula including the detection value acquired by the light detecting unit as a function and the detection value acquired by the light detecting unit being inserted into a formula of the function.

A thermal resistance from the temperature increase portion to a temperature fixed point of the temperature increase portion and a thermal capacity of the temperature increase portion may be recorded in the temperature calculation unit, and the temperature calculation unit may calculate the temperature of the temperature increase portion using a value acquired by dividing a temperature difference, the temperature difference being acquired by subtracting a temperature at the temperature fixed point of the temperature increase portion from the temperature of the temperature increase portion, by the thermal resistance from the temperature increase portion to the temperature fixed point of the temperature increase portion as a heat outflow amount flowing out of the temperature increase portion and using a value acquired by multiplying the thermal capacity of the temperature increase portion by the temperature difference acquired by subtracting the temperature at the temperature fixed point of the temperature increase portion from the temperature of the temperature increase portion as the energy that has accumulated in the temperature increase portion.

In the laser apparatus configured as described above, the amount of heat flowing out of the temperature increase portion and the energy that has accumulated in the temperature increase portion are determined from the thermal resistance from the temperature increase portion to the temperature fixed point and the thermal capacity of the temperature increase portion, both of which are determined in advance by thermal analysis, experiment, and so on. Hence, the amount of heat flowing into the temperature increase portion can be calculated quickly, and as a result, the temperature of each temperature increase portion can be calculated quickly.

The temperature calculation unit may calculate the temperature of a linear temperature increase portion using a thermal capacity thereof per unit length and a thermal resistance thereof per unit length up to the temperature fixed point.

In the laser apparatus configured as described above, the temperature increase in a linear site such as an optical fiber can also be calculated.

The laser apparatus may also include a plurality of the light detecting unit so that an amount of reflection light propagating through a core of the optical fiber and an amount of reflection light propagating through cladding of the optical fiber can be detected separately from detection results acquired by the plurality of light detecting unit.

In the laser apparatus configured as described above, depending on the temperature increase portion, reflection light propagating through the core of the optical fiber affects the temperature increase therein differently to reflection light propagating through the cladding of the optical fiber, and therefore, by detecting the respective amounts of reflection light propagating through the core and reflection light propagating through the cladding separately, the heat inflow amount flowing into each temperature increase portion can be calculated more precisely, with the result that the temperature of each temperature increase portion can also be calculated more precisely.

The laser apparatus may include a plurality of the light detecting unit, and at least one of the plurality of light detecting unit may have a different response wavelength characteristic to the other light detecting unit.

In the laser apparatus configured as described above, Stokes light, which has a longer wavelength than laser light and different optical characteristics, such as reflectance in an FBG (Fiber Bragg Grating) of a fiber laser, to laser light, as well as radiant light and plasma light, which are radiated from laser-processed parts and differ from laser light in terms of a ratio between the detection result and the amount of heat due to a difference in energy per photon, can be detected separately, and as a result, the amount of heat flowing into each temperature increase portion can be calculated more precisely.

The emergency command determination unit may determine the emergency optical output command on the basis of a control method for feedback-controlling light output relative to the temperature of the temperature increase portion, or the temperature of the temperature increase portion and a transition thereof, using the calculated temperature of the temperature increase portion, calculated by the temperature calculation unit, as input data.

The feedback control described above is a simple control method, meaning that the load on the emergency command determination unit is small, and therefore the emergency optical output command can be determined substantially at the same time as the temperature of the temperature increase portion is calculated. As a result, countermeasures can be taken quickly when the temperature of the temperature increase portion exceeds the second predetermined temperature.

The emergency command determination unit may predict a transition of the temperature of the temperature increase portion following a certain point in time from at least calculated temperatures of the temperature increase portion calculated by the temperature calculation unit at and up to the certain point in time and either the optical output command that is currently being output by the control unit or the optical output command that is about to be output by the control unit, and determine the emergency optical output command by referring to the predicted transition of the temperature of the temperature increase portion.

In the laser apparatus configured as described above, feedback control is executed by referring to the predicted transition of the temperature of the temperature increase portion, and therefore the temperature of the temperature increase portion can be controlled more precisely. As a result, the likelihood of the temperature of the temperature increase portion greatly exceeding the second predetermined temperature can be reduced.

The laser apparatus may be configured such that light output of the laser light is stopped immediately when the calculated temperature of the temperature increase portion, calculated by the temperature calculation unit in relation to the temperature increase portion, reaches the first predetermined temperature or the temperature of the temperature increase portion exceeds the first predetermined temperature.

In the laser apparatus configured as described above, even in cases such as when an extremely large amount of reflection light is generated suddenly, laser light output is stopped as soon as the temperature calculated in relation to each temperature increase portion reaches or exceeds the first predetermined temperature. As a result, damage to the laser apparatus can be avoided.

The laser apparatus may be connected to a network together with the temperature calculation unit and share the temperature calculation unit with a plurality of laser apparatuses within the same cell, the plurality of laser apparatuses also being connected to the network.

In the laser apparatus configured as described above, the temperature calculation unit, which requires high-speed computing power in the order of microseconds, is shared among a plurality of laser apparatuses, and as a result, equipment costs can be reduced. Furthermore, by limiting the laser apparatuses that are connected to the shared temperature calculation unit over the network to laser apparatuses within the same cell, the temperature calculation unit can function as an edge computer such that the calculation results acquired by the temperature calculation unit can be transmitted to the control units and emergency command determination units of the laser apparatuses with substantially no time delay caused by communication or the like, and as a result, a delay in switching to the emergency optical output command and subsequent damage to the laser apparatuses can be prevented.

The temperature calculation unit may be connected communicably to a first learning unit of a first machine learning device, and with respect to at least one temperature increase portion of the laser apparatus, the first learning unit may learn, by machine learning, at least one of either a formula from which a physical quantity can be calculated or a physical quantity, among the heat inflow amount formula which includes the detection value acquired by the light detecting unit as a function and from which the amount of heat flowing into the temperature increase portion can be calculated, the thermal capacity of the temperature increase portion, and the thermal resistance from the temperature increase portion to the temperature fixed point. The temperature calculation unit may then calculate the temperature of the temperature increase portion by referring to a learning result acquired by the first learning unit, the learning result being obtained from the first learning unit and recorded in the temperature calculation unit.

Approximate values of the thermal capacity and thermal resistance of each temperature increase portion can be determined from material property values, thermal analysis, and so on, although there is no guarantee of precision therein, and therefore, by performing repeated tests, it is possible to determine the heat inflow amount flowing into each temperature increase portion as a formula (a polynomial or the like) that uses the detection value acquired by the light detecting unit as a function. Because it is difficult to control the amount of reflection light while emitting laser light, however, it is difficult to control the test conditions, and as a result, a lot of man-hours is required to determine the function with a favorable degree of precision. In the laser apparatus configured as described above, these physical quantities are determined by being learned repeatedly through machine learning and can therefore be determined precisely without human intervention.

The first machine learning device may include a first state observation unit, and at least during a learning period, the first state observation unit may be connected communicably to the control unit of a learning laser apparatus that is disposed to be capable of measuring the temperature of at least one temperature increase portion using at least one temperature detecting unit and that executes the optical output command in accordance with a learning optical output command program, whereby the first state observation unit observes the detection result acquired by the light detecting unit and a measurement result indicating the temperature of the temperature increase portion, acquired by the temperature detecting unit, as state data relating to the learning laser apparatus, processes the observed state data as required so that the data can be used easily by the first learning unit, and then outputs the data to the first learning unit. The first learning unit may then learn a model relating to the regularity of the state data of the learning laser apparatus, the state data including the detection result acquired by the light detecting unit and the measurement result indicating the temperature of the temperature increase portion, acquired by the temperature detecting unit, and constructs, as a learning result, a first learning model that includes at least one of either a formula from which a physical quantity can be calculated or a physical quantity, among the amount of heat flowing into the temperature increase portion, which can be calculated as a function of the detection value acquired by the light detecting unit, the thermal capacity of the temperature increase portion, and the thermal resistance from the temperature increase portion to the temperature fixed point.

In the laser apparatus configured as described above, a large number of detection results from the light detecting unit and measurement results indicating the temperature of the temperature increase portion are acquired while varying the laser output and the reflection light detection conditions as input data from the learning laser apparatus, in which the temperature detecting unit is disposed to be capable of measuring the temperature of the temperature increase portion, whereupon a model relating to the regularity or the like of the input data is machine-learned by unsupervised learning. As a result, a formula (a function) or a value assumed to be appropriate can be derived in relation to the formula from which the aforesaid physical quantities can be calculated, or the physical quantities.

In the laser apparatus, a second machine learning device having a second state observation unit, a label acquisition unit, and a second learning unit may be connected communicably to the control unit, the second state observation unit may observe state data expressing the state of the laser apparatus, including the optical output command, process the observed state data as required so that the data can be used easily by the second learning unit, and then output the data to the second learning unit as input data, and the label acquisition unit may acquire, as a label, time series data corresponding to the input data and relating to the calculated temperature of the temperature increase portion, calculated by the temperature calculation unit, and output an acquisition result to the second learning unit. Further, the second learning unit may include an error calculation unit that calculates an error in the label relative to the input data on the basis of a second learning model constructed from the input data in order to represent the label, and a learning model updating unit that updates the second learning model in accordance with the error. The emergency command determination unit may then predict the transition of the calculated temperature of the temperature increase portion with respect to the optical output command from the control unit by referring to a learning result learned by the second learning unit by repeatedly updating the second learning model, and determine and output the emergency optical output command as required so as to ensure that the temperature of the temperature increase portion does not exceed the second predetermined temperature.

In the laser apparatus configured as described above, by determining, through machine learning, the manner in which the temperature of the temperature increase portion varies in response to the optical output command when the laser apparatus is in various states, the temperature of the temperature increase portion with respect to the optical output command can be predicted precisely without human intervention.

More specifically, by setting the calculated temperature of the temperature increase portion as a label (correct answer data), inputting a large number of sample pairs of labels and input data expressing the state of the laser apparatus, including the optical output command, and constructing a learning model from the input data through unsupervised learning in order to represent the label, the calculated temperature of the temperature increase portion relative to the input data including the optical output command can be predicted comparatively easily.

In the laser apparatus, a third machine learning device having a third state observation unit, a determination data acquisition unit, a third learning unit, and a decision-making unit may be connected communicably to the control unit, the third learning unit may include a reward calculation unit and a value function updating unit, and the third state observation unit may observe state data expressing the state of the laser apparatus and including time series data relating to the optical output command up to a certain point in time and the calculated temperature of the temperature increase portion up to the certain point in time, process the observed state data as required so that the data can be used easily by the third learning unit, and then output the data to the third learning unit as input data. The decision-making unit may then refer to a learning result acquired by the third learning unit, and after predicting that the calculated temperature of the temperature increase portion will exceed the second predetermined temperature if the optical output command continues to be executed after the certain point in time, determine an optical output command by which it is estimated that the calculated temperature of the temperature increase portion following the certain point in time will be controlled to the second predetermined temperature, and output the determined optical output command to the control unit of the laser apparatus. Further, the determination data acquisition unit may acquire a difference between the calculated temperature of the temperature increase portion, the calculated temperature being the result of the optical output command determined and output by the decision-making unit, and the second predetermined temperature, as determination data, and output the acquired determination data to the reward calculation unit, and the reward calculation unit may calculate either a positive reward or a negative reward in response to the determination data. The value function updating unit may then update a value function on the basis of the calculated reward, and at a time outside a period in which the laser apparatus is used for learning, the emergency command determination unit of the laser apparatus may predict the transition of the calculated temperature of the temperature increase portion with respect to the optical output command from the control unit by referring to the value function, which serves as a learning result acquired by the third learning unit by repeatedly updating the value function, and determine and output the emergency optical output command as required so as to ensure that the temperature of the temperature increase portion does not exceed the second predetermined temperature.

In the laser apparatus configured as described above, by learning, through trial and error, the optimum action (output of the emergency optical output command) to be performed by the laser apparatus in each of various operating states on the basis of the determination data in order to cause the laser apparatus to perform a target operation, an optical output command for controlling the temperature of the temperature increase portion to a target temperature can be output more precisely without human intervention under conditions in which the state of the laser apparatus varies.

According to the present invention, by calculating, at high speed, the temperature of each temperature increase portion that may be damaged by a temperature increase caused by reflection light that varies at high speed and in various different ways over time, and switching from a previously set optical output command to an emergency optical output command for reducing the laser light output or the like as required on the basis of the calculated temperature of each temperature increase portion, an appropriate, sufficient, and required margin can be secured at all times, and as a result, a highly reliable laser apparatus exhibiting high machining efficiency, in which the laser light output is not reduced unnecessarily and the laser apparatus is not damaged, can be provided. Moreover, the physical quantities and formulae required to calculate the temperature of each temperature increase portion and the emergency optical output command for controlling the temperature of each temperature increase portion to a target temperature are determined by being learned through machine learning, and therefore human intervention is not required, meaning that development costs can be reduced. As a result, the aforesaid highly reliable laser apparatus exhibiting high machining efficiency can be provided without a large cost increase.

DETAILED DESCRIPTION OF THE PREFERRED EMBODIMENTS

Embodiments of a laser apparatus according to the present invention will be described below with reference to the figures. In the figures, identical members have been allocated identical reference symbols. Further, it is assumed that elements allocated identical reference symbols in different figures are constituent elements having identical functions. Note that in order to make the figures clearer, scales have been modified as appropriate.

First Embodiment

Figure 1:
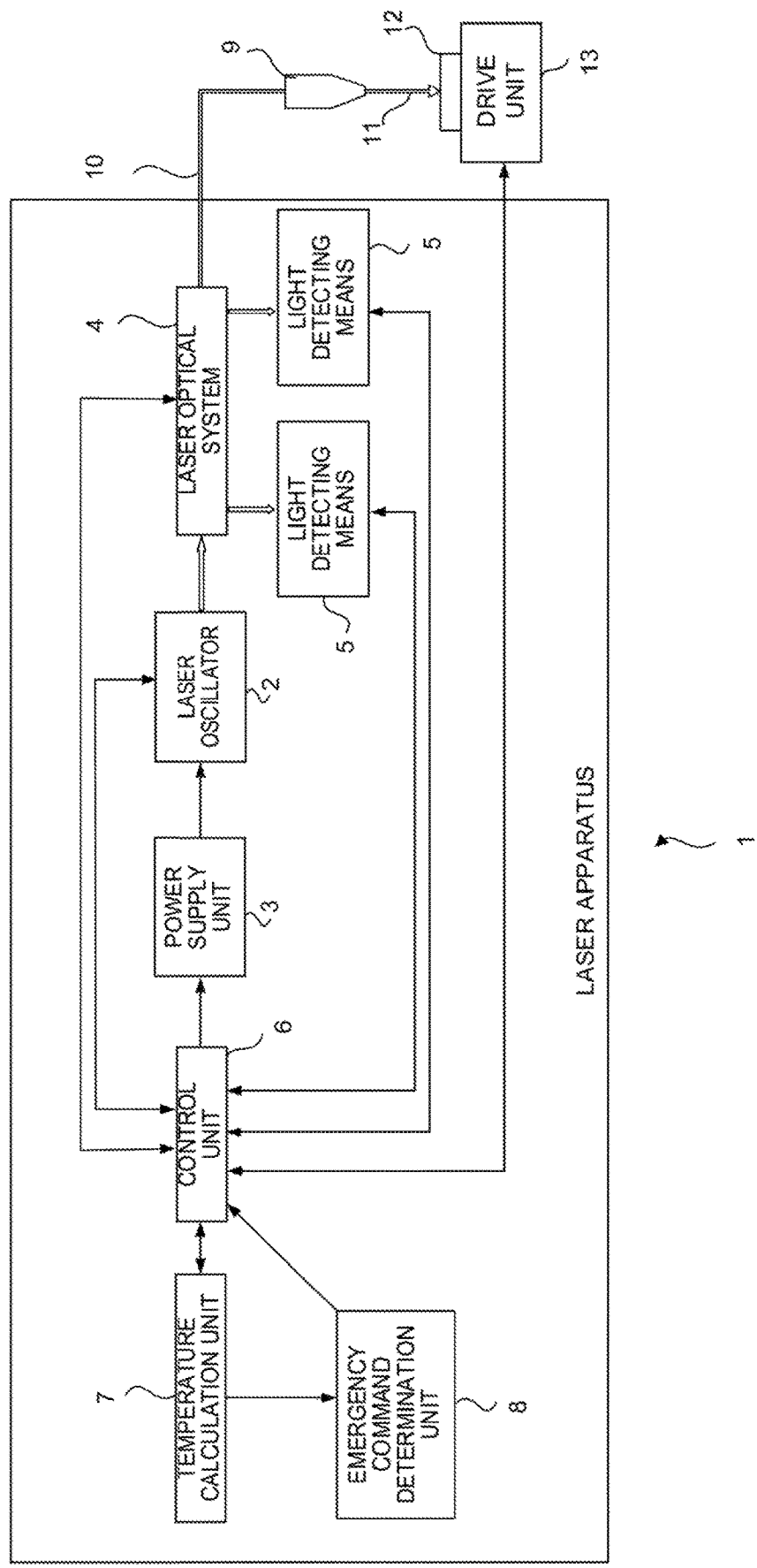
FIG. 1 is a block diagram showing a conceptual configuration of a laser apparatus according to a first embodiment of the present invention.

FIG. 1 is a block diagram showing a conceptual configuration of a laser apparatus according to a first embodiment of the present invention.

A laser apparatus 1 according to this embodiment includes a laser oscillator 2, a power supply unit 3, a laser optical system 4, two light detecting means 5, a control unit 6, a temperature calculation unit 7, and an emergency command determination unit 8.

The power supply unit 3 supplies a driving current to the laser oscillator 2. The laser optical system 4 includes a machining head 9 for irradiating a workpiece 12 serving as a laser machining subject with laser light 11 emitted from the laser oscillator 2 through an optical fiber 10. The two light detecting means 5 are respectively capable of detecting the laser light emitted from the laser oscillator 2 and reflection light propagating in a substantially opposite direction to the laser light. The control unit 6 outputs a control signal corresponding to an optical output command to at least each part of the laser apparatus 1 and outputs a current output command corresponding to the optical output command to the power supply unit 3. The temperature calculation unit 7 uses detection results acquired by the light detecting means 5 to calculate the temperature of at least one temperature increase portion among respective temperature increase portions of the laser apparatus 1 that increase in temperature at least in response to the reflection light. The emergency command determination unit 8 refers to the temperatures of the respective temperature increase portions, calculated by the temperature calculation unit 7, and to ensure that the temperature of each temperature increase portion does not exceed a first predetermined temperature, which is an allowable upper limit temperature of each temperature increase portion and is set at a lower temperature than an upper limit heat resistance temperature of each temperature increase portion using the upper limit heat resistance temperature as a reference, and determines and outputs as required an emergency optical output command with the aim of controlling the temperature of the temperature increase portion either to a second predetermined temperature, which is a control target temperature of each temperature increase portion and is set at a lower temperature than the first predetermined temperature, or to a lower temperature than the second predetermined temperature. When the emergency command determination unit 8 outputs the emergency optical output command, the control unit 6 is configured to switch the optical output command output thereby to the emergency optical output command and output the emergency optical output command.

In FIG. 1, the black-outlined arrow simulates the laser light, and the solid line arrows simulate signal lines and the like as well as signal directions. This applies likewise to block diagrams showing conceptual configurations following FIG. 1.

Note that in FIG. 1, the machining head 9 and the optical fiber 10 are shown together with the laser optical system 4, but in this application, unless specifically indicated otherwise, the term "the laser optical system 4" includes the machining head 9, the optical fiber 10, and so on, and when the laser oscillator 2 uses a laser diode module as an excitation light source, it is assumed that an optical amplification medium such as an amplifying optical fiber and an optical system for inputting the laser light into the optical amplification medium are also included in the laser optical system. Furthermore, when the laser oscillator 2 uses a laser diode module as a laser light source, it is assumed that a multiplexer for multiplexing the laser light from the laser diode module and so on are also included in the laser optical system.

A part of the laser light emitted from the laser oscillator 2 may be reflected by the surface of the workpiece (the laser machining subject), a transmission window of the machining head 9, or the like so as to propagate through the laser optical system 4 in an opposite direction to the laser light emitted from the laser oscillator 2, thereby raising the temperatures of respective parts of the laser oscillator 2 and the laser optical system 4 so as to cause damage thereto. Hence, the purpose of the present invention is to ensure that the respective parts of the laser oscillator 2 and the laser optical system 4 are never damaged due to an excessive increase in the temperature thereof while also ensuring that laser light output is not reduced unnecessarily, leading to machining defects and a reduction in machining efficiency, by calculating the temperature of each temperature increase portion that is damaged by a temperature increase caused by at least reflection light, and switching the optical output command as required on the basis of the temperature of each temperature increase portion, i.e. the calculation result, so that the temperature of each temperature increase portion does not reach or exceed a predetermined temperature.

Note that in FIG. 1, a drive unit 13 is used to vary relative positions of the machining head 9 with respect to the workpiece 12, and either the position on the machining head 9 side may be varied by gripping the machining head 9 using a robot hand or the like and the optical output command may include a command that is output to the drive unit 13 to vary the relative positions of the machining head 9 with respect to the workpiece 12. Further, by replacing the workpiece 12 with light detecting means 5 other than those shown in FIG. 1, the drive unit 13 can be used to check whether or not a deviation has occurred between the optical output command and the actual light output in accordance with a predetermined schedule, and by replacing the workpiece 12 with an adsorber, the drive unit 13 can be used to check whether or not reflection light other than the reflection light from the workpiece 12 has increased due to contamination of the transmission window of the machining head 9 or the like.

Furthermore, in FIG. 1, each unit denotes a function block, but the functions of a plurality of function blocks may be provided in a single function block. For example, the temperature calculation unit 7 and the emergency command determination unit 8 may be integrated with the control unit 6 such that the control unit 6 includes the functions of the temperature calculation unit 7 and the emergency command determination unit 8.

Next, as regards the method by which the temperature calculation unit 7 calculates the temperatures of the respective temperature increase portions, the underlying formula of the method is an energy conservation formula in which a value acquired by subtracting a time integral of a heat outflow amount, i.e. the amount of heat flowing out of each temperature increase portion, from a time integral of a heat inflow amount, i.e. the amount of heat flowing into each temperature increase portion, matches the additional energy that accumulates in each temperature increase portion from a state of thermal equilibrium.

Figure 2:
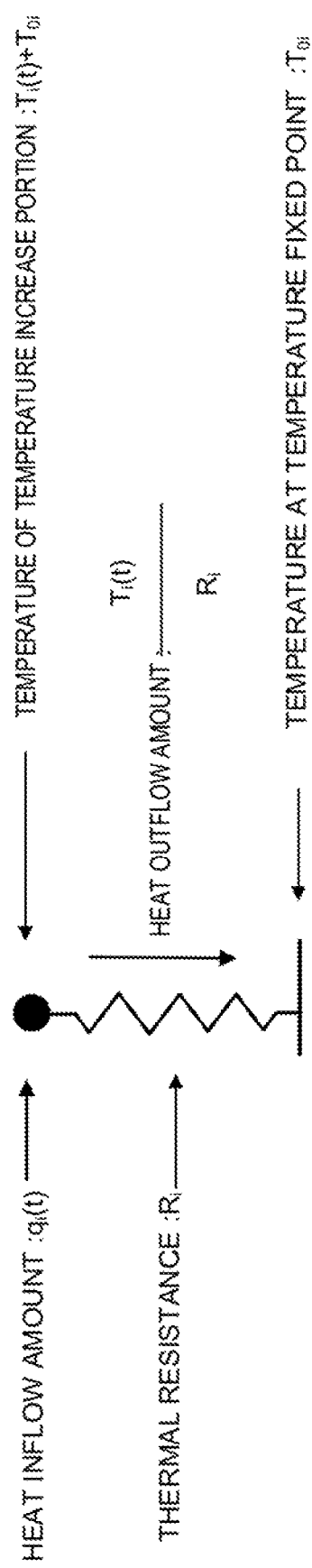
FIG. 2 is a pattern diagram showing a flow of heat through a temperature increase portion.

This energy conservation formula is illustrated more specifically in formula (1) below, and FIG. 2 is a pattern diagram showing a heat flow that represents the heat inflow amount flowing into one temperature increase portion and the heat outflow amount (a heat dissipation amount) from the temperature increase portion.

$$\int_{t'=0}^{t} q_i(t')dt' - \int_{t'=0}^{t} \frac{T_i(t')}{R_i}dt' = C_i \cdot T_i(t) \quad (1)$$

In formula (1), $q_i(t)$ is the heat inflow amount (W) flowing into each temperature increase portion, which varies over time, i being a suffix for identifying the temperature increase portion. Hence, the first term on the left side of formula (1) is the time integral of the heat inflow amount (W) flowing into the temperature increase portion. Further, $T_i(t)$ is a temperature difference acquired by subtracting the temperature at a temperature fixed point of the temperature increase portion from the temperature of the temperature increase portion, and thereby indicates a temperature increase (K) from the temperature at the temperature fixed point. The temperature fixed point of the temperature increase portion is a point (a position or a location) at which the temperature of each of the temperature increase portions reaches an identical temperature in a state of thermal equilibrium, i.e. when the heat inflow amount into the temperature increase portion is 0 (zero). When the temperature increase portion is thermally connected to a water-cooled plate, the cooling water serves as the temperature fixed point, but peripheral air by which the temperature increase portion is air-cooled may also be considered as the temperature fixed point. $R_i$ denotes thermal resistance (K/W) between the temperature increase portion and the temperature fixed point of the temperature increase portion. Hence, the second term on the left side of formula (1) is the time integral of the heat outflow amount (W) flowing out of the temperature increase portion. $C_i$ denotes the thermal capacity (J/K) of the temperature increase portion. Hence, the right side of formula (1) is the energy (J) that has accumulated in the temperature increase portion. Note that the temperature at the temperature fixed point can be detected using normal temperature detecting means, for example.

It is not impossible to calculate the temperature of the temperature increase portion from formula (1) by determining an approximate solution using a numerical analysis method such as a finite element method, but obtaining a solution takes time, making it difficult to control the laser light output in the order of microseconds. However, by time-differentiating both sides of formula (1), formula (2) is obtained, and with this first-order linear ordinary differential equation, a general solution can be determined. This general solution can be expressed as shown in formula (3).

$$q_i(t) - \frac{T_i(t)}{R_i} = C_i \frac{dT_i(t)}{dt} \quad (2)$$

$$T_i(t) = \left\{ \int_{t'=0}^{t} \left[ \frac{q_i(t')}{C_i} \exp\left(\frac{t'}{C_i \cdot R_i}\right) \right] dt' \right\} \exp\left(-\frac{t}{C_i \cdot R_i}\right) \quad (3)$$

The temperature of each of the temperature increase portions can be calculated as a general solution of a differential equation, and therefore, in contrast to a case where an approximate solution is determined using a numerical analysis method such as a finite element method, as described above, the laser light output can be controlled in the order of microseconds by employing a high-performance computer as the temperature calculation unit. As a result, a situation in which reduction of the laser light output is delayed such that the laser apparatus 1 is damaged by reflection light can be prevented. Moreover, using the temperature calculated in relation to each temperature increase portion, the laser light output is reduced only as required, or more specifically when the temperature of the temperature increase portion exceeds or is about to exceed a predetermined temperature (the "second predetermined temperature" to be described below), and therefore avoidable machining defects and unnecessary reductions in the machining efficiency can be prevented from occurring.

Note that when the temperature of the temperature increase portion is calculated using formula (3), it is not always necessary to perform an integral calculation as a mathematical operation, and it goes without saying that the temperature of each of the temperature increase portions may also be calculated by replacing the integral part with an approximate sum, as shown in formula (4).

$$\int_{t'=0}^{t} f(t')dt' = \sum_{i=1}^{n} f(t_i)\Delta t \quad (4)$$

Here, $\Delta t = t/n$, $f(t_1) = f(0)$, $f(t_n) = f(t-\Delta t) \approx f(t)$

Note that in order to calculate the temperature of the temperature increase portion using the formulae illustrated above, the respective thermal resistances from the temperature increase portions to the temperature fixed points of the temperature increase portions and the thermal capacities of the temperature increase portions are preferably recorded in the temperature calculation unit 7. As regards a linear temperature increase portion such as an optical fiber, the temperature of the linear temperature increase portion is preferably calculated using the thermal capacity thereof per unit length and the thermal resistance thereof per unit length up to the temperature fixed point. If the properties and structures of the respective temperature increase portions are known, the thermal resistances and thermal capacities of the temperature increase portions can be estimated by thermal analysis or the like.

Further, in order to calculate the heat inflow amount flowing into each temperature increase portion, which is used in the above formulae, a heat inflow amount formula, which includes the detection value of at least one of the light detecting means 5 as a function and from which the heat inflow amount flowing into the temperature increase portion can be calculated, is preferably recorded in the temperature calculation unit 7. Furthermore, even in a state where no reflection light exists, the temperature of the temperature increase portion is often raised by the laser light emitted from the laser oscillator 2, and therefore, regarding the heat inflow amount flowing into the temperature increase portion, it is preferable to take into consideration at least both the laser light output and the amount of reflection light. To cope with the effect of the laser light output in the calculation of the heat inflow amount flowing into the temperature increase portion, the detection result from the light detecting means 5 may be used, or the optical output command may be used instead of the detection result from the light detecting means 5. When the optical output command is used, the amount of reflection light can be detected on the assumption that an increase in the optical output command from the detection value acquired by the light detecting means 5 in a state where no reflection light exists is caused by reflection light. Moreover, by using at least two light detecting means 5, the laser light output and the reflection light can be detected separately.

Further, regarding the reflection light, reflection light that propagates through the core of the optical fiber 10 differs from reflection light that propagates through the cladding of the optical fiber in terms of the effect thereof on the temperature increase in the temperature increase portion in that the former is more likely to propagate deep into the laser apparatus 1 whereas the latter leaks out from the optical fiber 10 further toward the front side (the laser optical system 4 side), and so on. As shown in FIG. 1, therefore, the light detecting means 5 is preferably provided in a plurality so that the amount of reflection light propagating through the core of the optical fiber 10 and the amount of reflection light propagating through the cladding of the optical fiber 10 can be detected separately from the detection results acquired by the plurality of light detecting means 5. For example, when a splice of an optical fibers is provided between the left-side light detecting means 5 and the right-side light detecting means 5 in FIG. 1, the right-side light detecting means 5 is capable of detecting reflection light propagating through the cladding but substantially incapable of detecting reflection light propagating through the core. However, a part of the reflection light propagating through the core leaks out of the core into the cladding at the splice, and therefore the left-side light detecting means 5 can detect the reflection light propagating through the core. As a result, the reflection light propagating through the core of the optical fiber 10 and the reflection light propagating through the cladding of the optical fiber 10 can be detected separately from the detection results acquired by the left-side and right-side light detecting means 5.

Furthermore, when providing the plurality of light detecting means 5, it is effective to provide several of the plurality of light detecting means 5 with different response wavelength characteristics to the other light detecting means 5 by configuring these light detecting means 5 to detect light of different wavelengths from that of the laser output light. The heat inflow amount flowing into the temperature increase portion can be calculated more accurately by detecting reflection light (return light) having different wavelengths to the laser light, such as Stokes light generated when excitation photons are converted into low-frequency photons and phonons of a molecular vibration mode, radiant light and plasma light radiated from the laser machining parts of the workpiece, and so on, for example, in distinction from the laser light. The reason for this is that when the wavelength differs, the reflectance on an FBG (Fiber Bragg Grating) of a fiber laser, the reflectance on an anti-reflection film of an optical component, and so on differ from the reflectance of laser light, and therefore, even if the number of photons detected by the light detecting means per unit time remains the same, the number of photons propagating to the temperature increase portion varies. Further, when the wavelength differs, the energy per photon also differs, and as a result, the amount of heat flowing into the temperature increase portion varies. The light detecting means 5 having different response wavelength characteristics may be realized by a method of employing photodiodes having semiconductors with different energy gaps, forming the transmission windows or the like through which light enters from band pass filters having different transmission wavelengths, and so on.

As described above, the heat inflow amount flowing into the temperature increase portion is generally estimated more accurately as the number of light detecting means 5 increases, and therefore the number of light detecting means 5 is not limited to the two means shown in FIG. 1. Further, the detection positions of the light detecting means 5 shown in FIG. 1 are merely examples, and the detection positions are not limited thereto. Furthermore, the output from the light detecting means 5 may be input into the temperature calculation unit 7 or the emergency command determination unit 8 directly, i.e. without passing through the control unit 6.

Here, an example of a method for determining a formula by which the heat inflow amount flowing into each temperature increase portion can be calculated from the detection values of the light detecting means 5, which are preferably recorded in the temperature calculation unit 7 in advance, in a case where n light detecting means 5 are provided will be described briefly.

The heat inflow amount ($q_i(t)$) flowing into a certain temperature increase portion (the $i^{th}$ temperature increase portion) can be expressed approximately as a function of the detection values ($x_j(t)$: j=1, 2, ..., n) of the n light detecting means 5 and the optical output command ($y(t)$) using a polynomial of $x_j(t)$ and $y(t)$, such as that shown below in formula (5), for example.

$$q_i(t) = a_{i11} x_1 + a_{i12} x_1^2 + a_{i13} x_1^3 + \ldots + a_{i1m} x_1^m + a_{i21} x_2 + \quad (5)$$
$$a_{i22} x_2^2 + a_{i23} x_2^3 + \ldots + a_{i2m} x_2^m + a_{i31} x_3 + a_{i32} x_3^2 +$$
$$a_{i33} x_3^3 + \ldots + a_{i3m} x_3^m + \ldots + a_{in1} x_n + a_{in2} x_n^2 + a_{in3} x_n^3 +$$
$$\ldots + a_{inm} x_n^m + b_{i1} y + b_{i2} y^2 + b_{i3} y^3 + \ldots + b_{im} y^m + c_i$$

In formula (5), $x_j$ and y are functions of time, as described above, but for simplicity, (t) has been omitted.

Here, by setting up normal temperature detecting means 19, a thermography device capable of remotely sensing a two-dimensional temperature distribution, or the like in a test laser apparatus 1 so that the temperature of each temperature increase portion can be measured, implementing a test repeatedly under conditions in which various optical output commands and various types of reflection light are generated, and gradually determining the respective coefficients, such as $a_{ijk}$ and $b_{ik}$, and the constant $c_i$ of the polynomial so that the temperatures indicated by the calculation results acquired in relation to the respective temperature increase portions, which are determined by inserting $q_i(t)$ of formula (4) into $q_i(t)$ of formula (3), match the temperatures indicated by the measurement results, the heat inflow amounts flowing into the respective temperature increase portions can be calculated from the detection results of the light detecting means 5 using formula (4). Note that the thermal resistances and thermal capacities of the respective temperature increase portions, which are required to calculate the temperatures of the respective temperature increase portions using formula (3), can be estimated by thermal analysis or the like, as described above, and therefore values estimated by thermal analysis or the like may be used.

Once the constant of the polynomial of formula (5) has been determined, the heat inflow amounts flowing into the respective temperature increase portions are ascertained from the detection results of the light detecting means 5, and by inserting the heat inflow amounts into formula (3), the temperatures of the respective temperature increase portions can be calculated substantially in real time. As a result, the temperature of each temperature increase portion can be controlled either to the second predetermined temperature or to a lower temperature than the second predetermined temperature.

Note, however, that when the number n of light detecting means 5 is increased or a higher order polynomial is formed by increasing m in order to improve the calculation precision, it takes an extremely long time to determine all of the constants of the polynomial of formula (4) precisely, and this is substantially impossible for a human to achieve. Therefore, a formula by which the heat inflow amounts flowing into the respective temperature increase portions can be calculated from the detection values of the light detecting means 5 is preferably determined by machine learning, i.e. without human intervention. A method for determining a formula by which the respective heat inflow amounts can be calculated by machine learning will be described later.

Here, the manner in which effects differing from the prior art can be acquired by calculating the temperatures of the temperature increase portions in the manner described above will now be described on the basis of actual calculation examples.

FIGS. 3 to 7 are graphs showing actual calculation examples.

Figure 3:
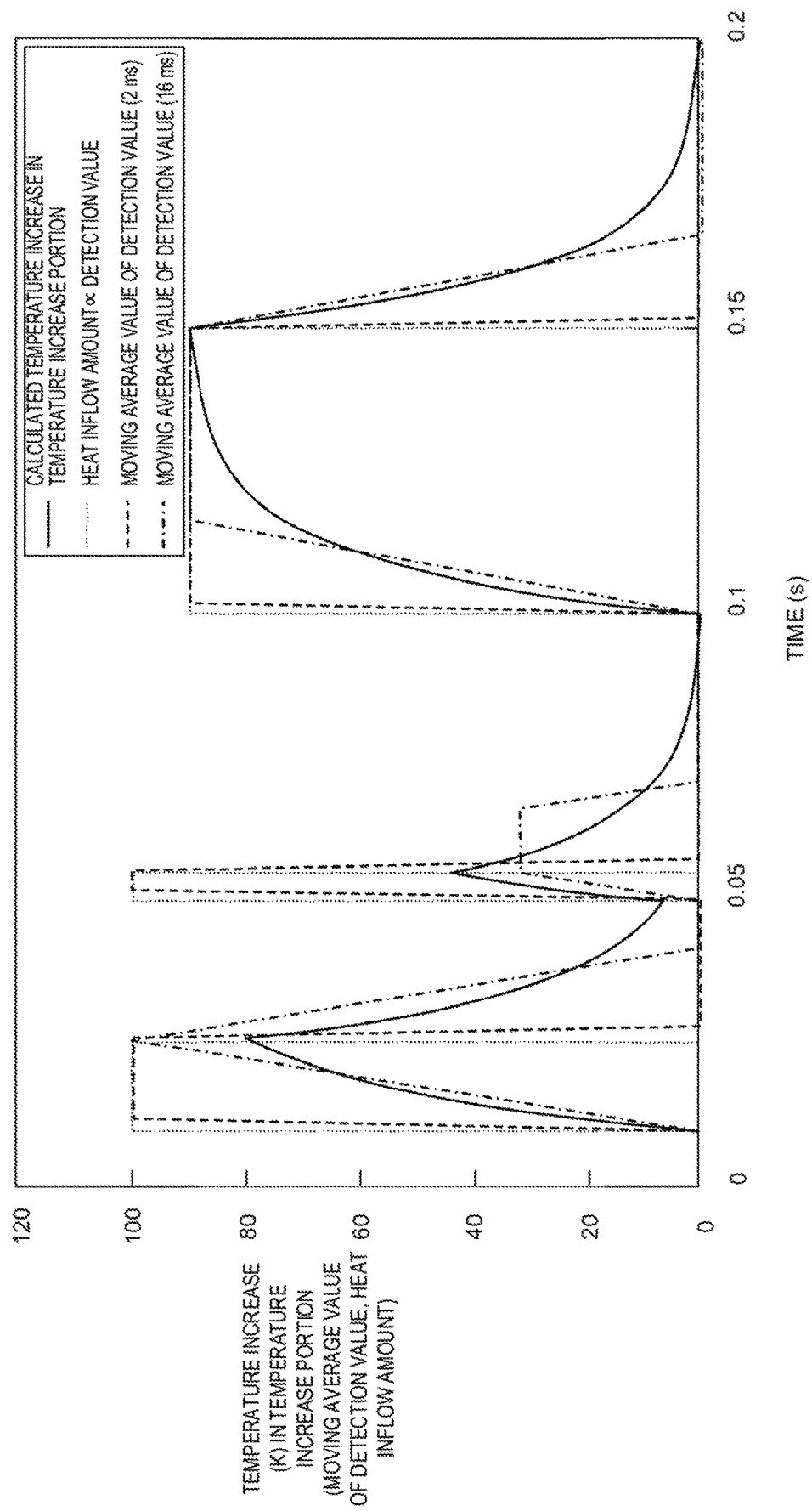
FIG. 3 is a view showing, for comparison purposes, both a graph of an example in which a temperature increase in the temperature increase portion is calculated by the laser apparatus of FIG. 1 and a graph of a moving average value of a detection value acquired by light detecting means according to the prior art.

First, FIG. 3 shows a calculation example in a case where the thermal capacity of a certain temperature increase portion is 0.01 J/K, the thermal resistance up to the temperature fixed point is 10 K/W, and a heat inflow amount of 10 W or 9 W flows intermittently into the temperature increase portion. The temperature increases in the temperature increase portion are indicated by thick solid lines. Thin dotted lines denote values acquired by multiplying the heat inflow amount by 10, albeit using a different unit, and therefore 100 on the scale of the vertical axis indicates a heat inflow amount of 10 W. In response to an initial heat inflow amount pulse, the temperature of the temperature increase portion increases to 80 K above the temperature at the temperature fixed point, and therefore, if the temperature at the temperature fixed point +80 K is set as the second predetermined temperature of the temperature increase portion, the emergency optical output command is determined and the optical output command is switched thereto when the temperature increases above this value.

Meanwhile, for comparison, thick dotted lines and thick dot-dash lines respectively show moving average values of the detection value of the light detecting means. The moving average time width is 2 milliseconds in the case of the former and 16 milliseconds in the case of the latter, and the respective detection sensitivities are regulated to substantially identical maximum values on the graph. In both cases, the moving average value of the detection value of the initial pulse is 100, and in relation to this pulse, it appears that the predetermined value (the threshold) for reducing or stopping light output should be set at 100. If the pulse is short, however, as with the second pulse, when the moving average time width is narrow, the moving average value of the detection value reaches 100 even though the temperature of the temperature increase portion only increases by approximately 44 K, and as a result, the laser light output is reduced or stopped unnecessarily. Hence, when the threshold is set in relation to the moving average value of the detection value of the light detecting means 5 in a case where the moving average time width is narrow or the peak value of the detection value of the light detecting means 5, the laser light output is reduced or stopped unnecessarily. The likelihood of the laser light output being reduced or stopped unnecessarily can be reduced by increasing the threshold, but this leads to an increase in the risk of damage occurring when the temperature of the temperature increase portion increases excessively before reaching the threshold in response to a slightly longer pulse. As regards the moving average value of the detection value of the light detecting means 5 in a case where the moving average time width is wide, on the other hand, the temperature of the temperature increase portion exceeds 80 K and reaches 90 K in response to a long but slightly lower pulse, such as the third pulse, even though the moving average value remains at 90 and does not reach the threshold of 100, and therefore the threshold must be set at or below 90.

Figure 4:
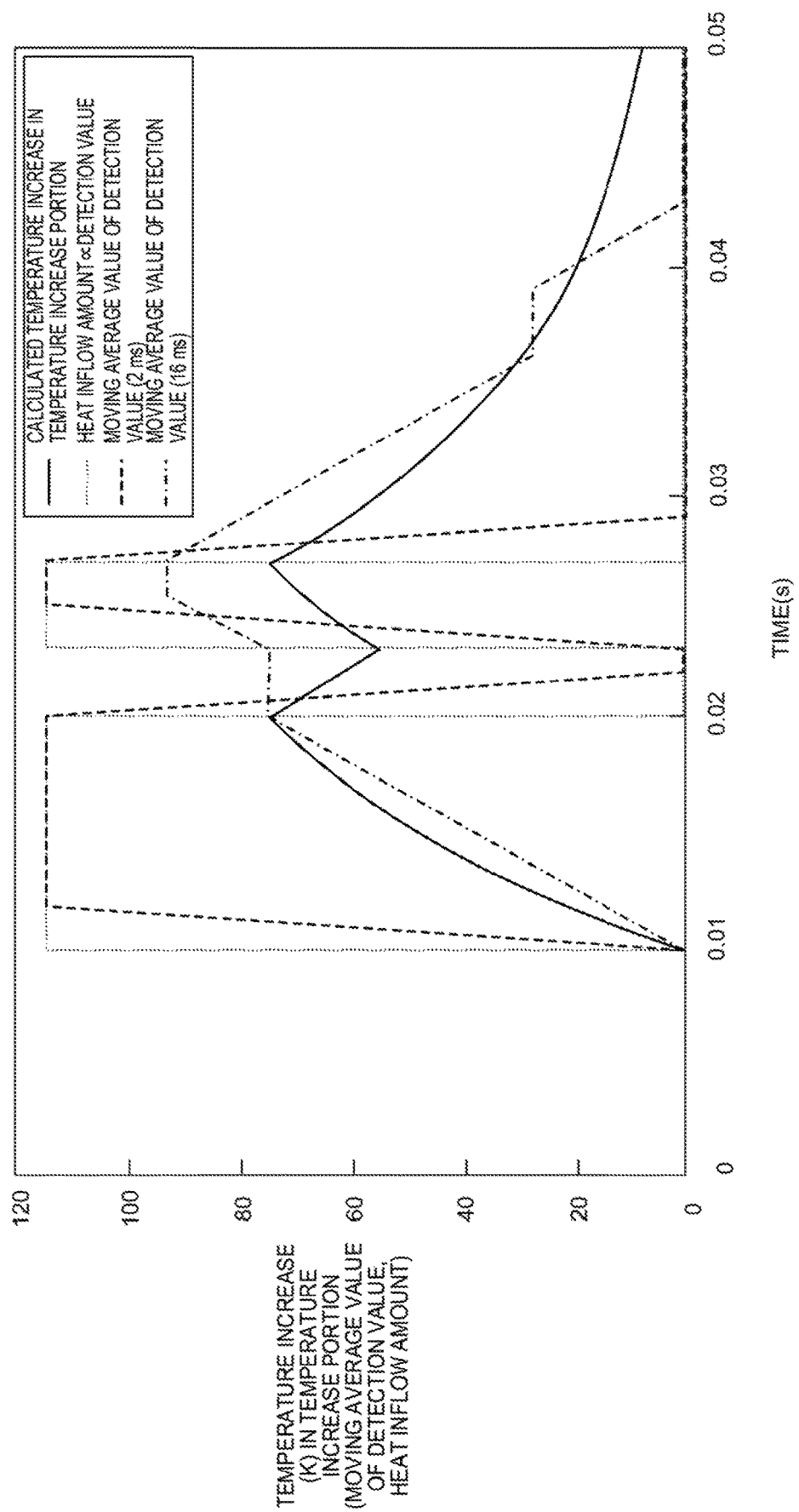
FIG. 4 is a view showing, for comparison purposes, both a graph of an example in which the temperature increase in the temperature increase portion is calculated by the laser apparatus of FIG. 1 and a graph of the moving average value of the detection value acquired by the light detecting means according to the prior art.

FIG. 4 is a graph having the same conditions as FIG. 3, apart from the pulse condition. In FIG. 4, the maximum temperature increase of the temperature increase portion is 75 K, but the moving average value of the detection value of the light detecting means 5 in a case where the moving average time width is wide remains affected by the previous pulse so as to increase to a maximum of approximately 93, and therefore the threshold must be set at or above 93 to ensure that the laser light output is not reduced or stopped unnecessarily. In other words, in response to a pulse such as the third pulse in FIG. 3, the threshold must be set at or below 90 to prevent damage to the temperature increase portion, but in response to pulse waveforms such as those shown in FIG. 4, the threshold must be set at or above 93 to ensure that the laser light output is not reduced or stopped unnecessarily. This means that it is impossible to set the threshold to prevent both damage to the temperature increase portion and unnecessary reduction or stoppage of the laser light output.

Providing a threshold on an integrated value of the detection value of the light detecting means 5 over a predetermined time is essentially exactly the same as providing a threshold on the moving average value of the detection value, and it is therefore impossible to set a threshold by which both damage to the temperature increase portion and unnecessary reduction or stoppage of the laser light output are prevented.

Alternatively, the setting method may be based on the detection value of the light detecting means 5 exceeding the threshold a predetermined number of times within a predetermined time period. The reason why it is impossible to set a threshold by which both damage to the temperature increase portion and unnecessary reduction or stoppage of the laser light output are prevented likewise in this case will now be described using FIGS. 5 to 7.

Figure 5:
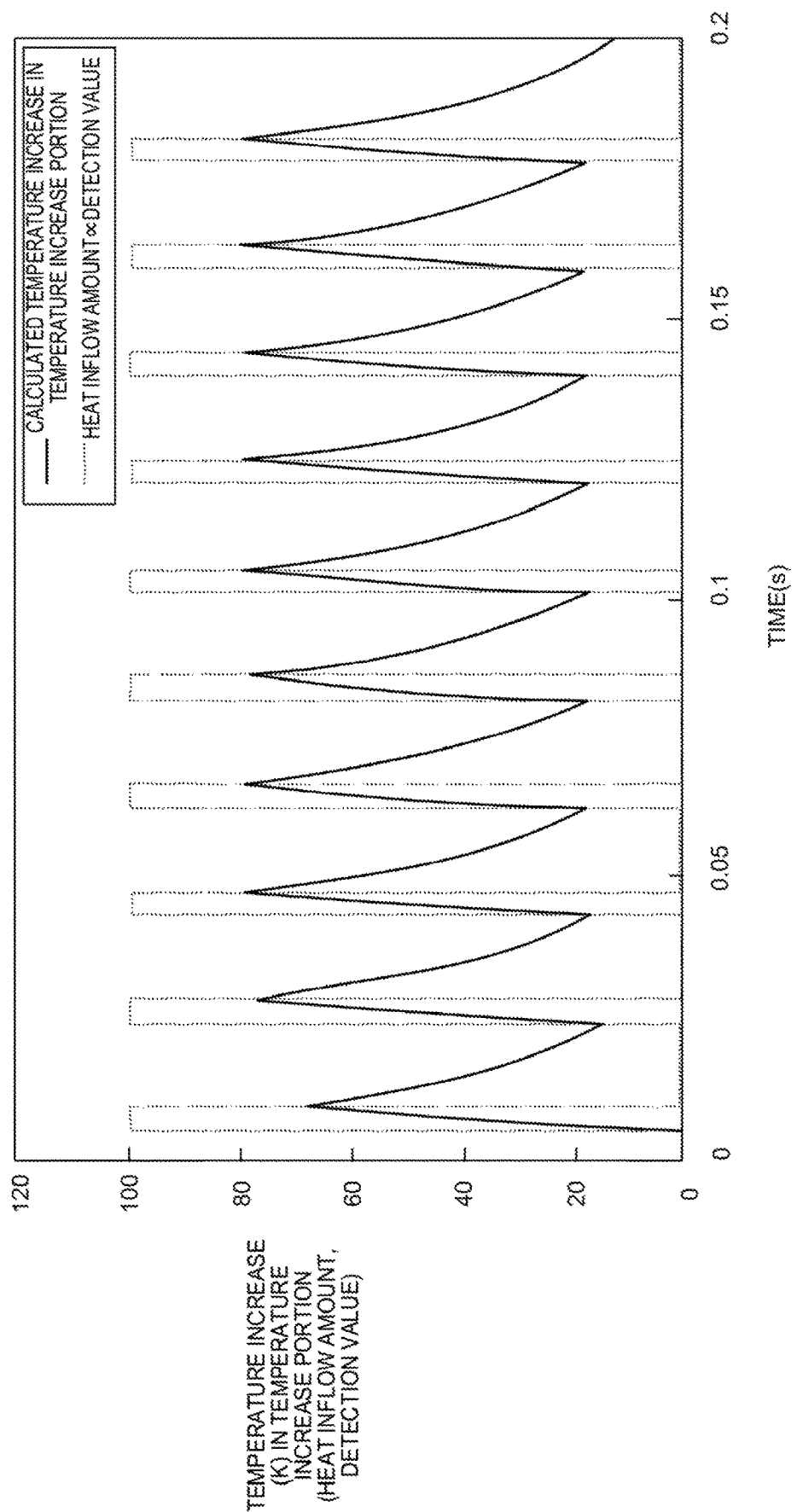
FIG. 5 is a view showing a graph of an example in which the temperature increase in the temperature increase portion is calculated by the laser apparatus of FIG. 1 in a case where the amount of heat flowing into the temperature increase portion varies in pulse form, assuming that a detection value of reflection light or the like detected by the light detecting means is proportionate to the amount of heat flowing into the temperature increase portion.
Figure 6:
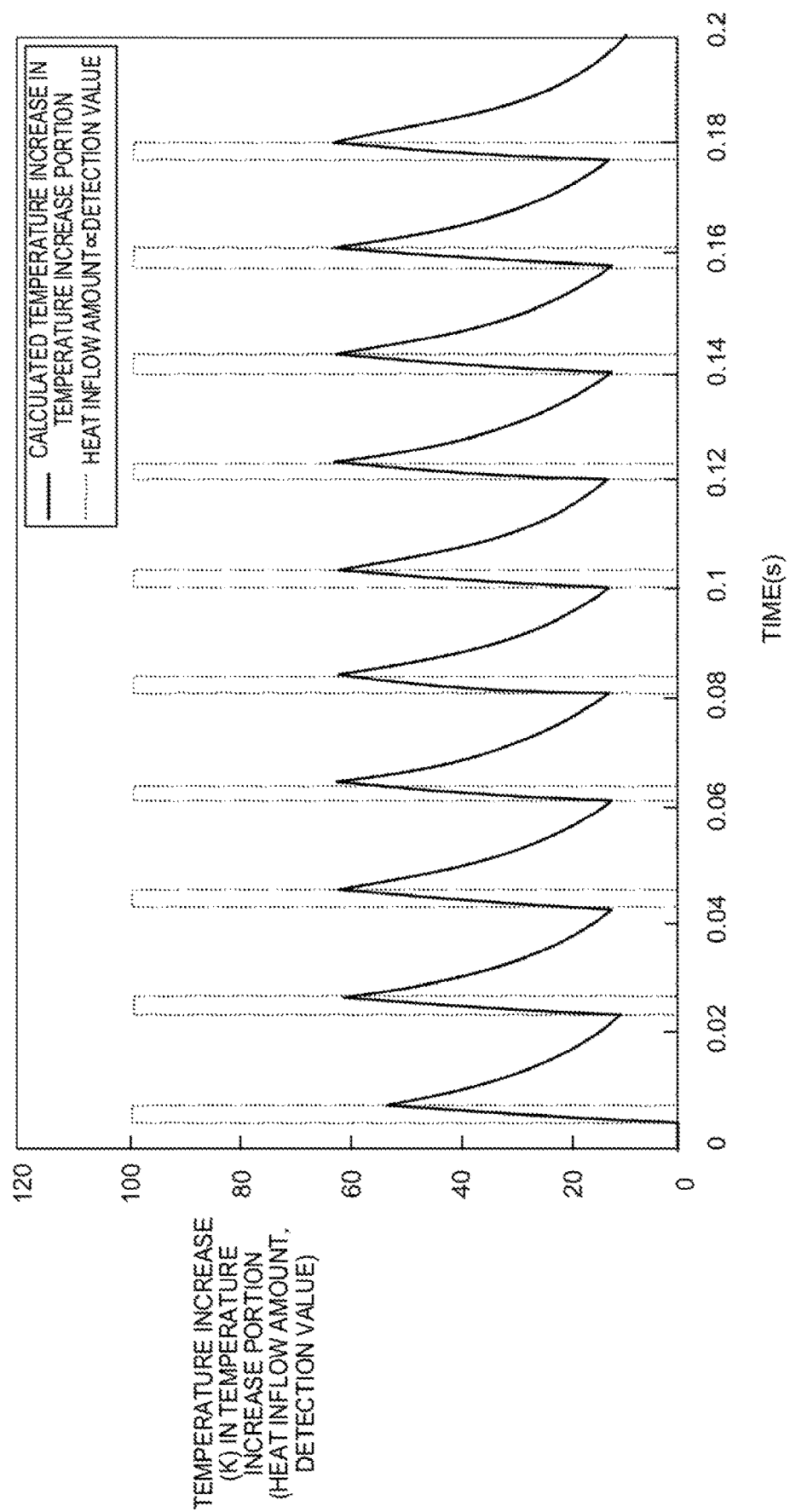
FIG. 6 is a view showing a graph of an example in which the temperature increase in the temperature increase portion is calculated by the laser apparatus of FIG. 1 in a case where the amount of heat flowing into the temperature increase portion varies in pulse form, assuming that the detection value of reflection light or the like detected by the light detecting means is proportionate to the amount of heat flowing into the temperature increase portion.
Figure 7:
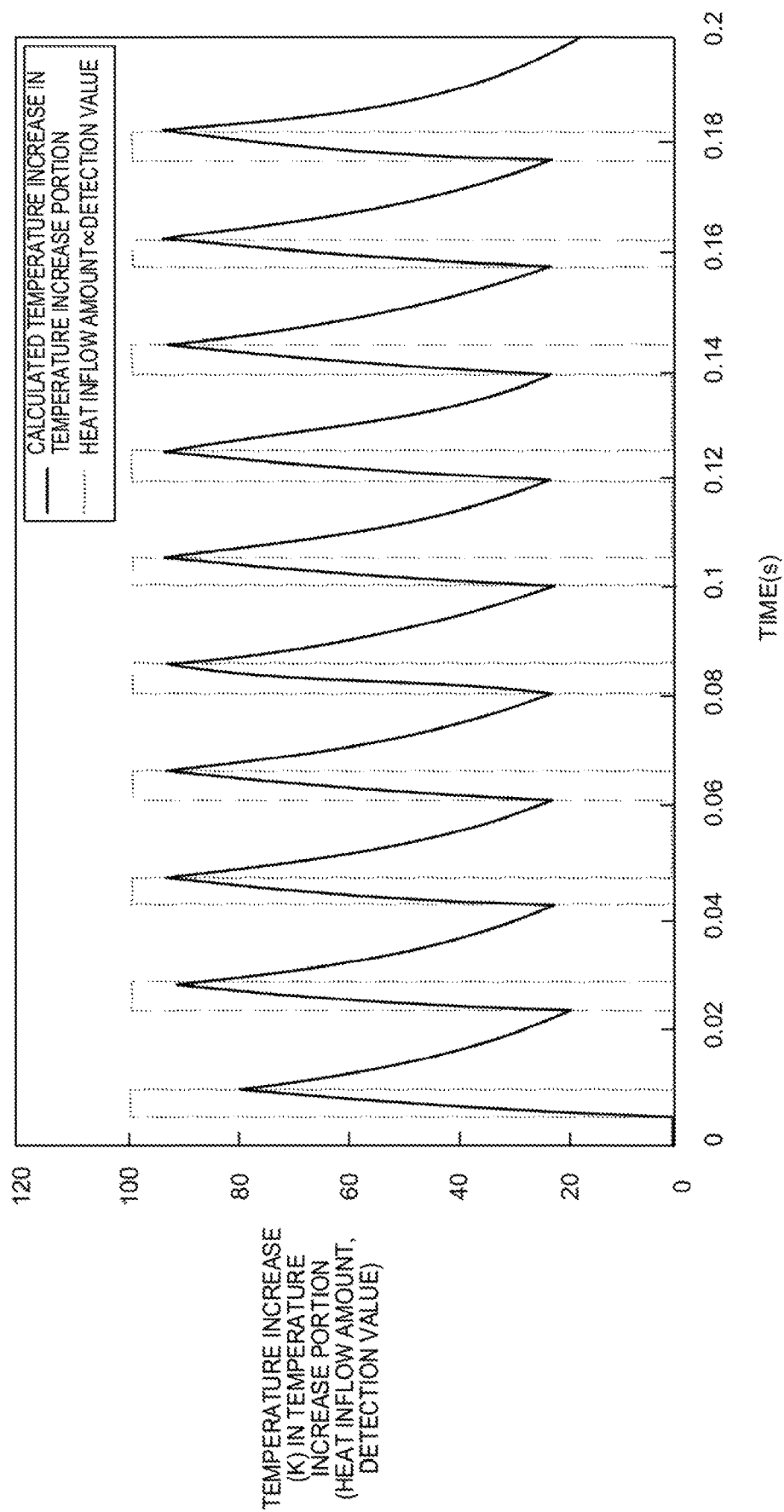
FIG. 7 is a view showing a graph of an example in which the temperature increase in the temperature increase portion is calculated by the laser apparatus of FIG. 1 in a case where the amount of heat flowing into the temperature increase portion varies in pulse form, assuming that the detection value of reflection light or the like detected by the light detecting means is proportionate to the amount of heat flowing into the temperature increase portion.

The thermal property parameters of the temperature increase portion in which the temperature increase is calculated are identical to those shown in FIGS. 3 and 4, and the temperature increase in the temperature increase portion is indicated by thick solid lines. Thin dotted lines denote values acquired by multiplying the heat inflow amount by 5, albeit using a different unit, and therefore 100 on the scale of the vertical axis indicates a heat inflow amount of 20 W. The detection value acquired by the light detecting means 5 is assumed to be proportionate to the heat inflow amount and therefore takes an identical value to the heat inflow amount. In FIG. 5, using 100 as the predetermined value (the threshold), at the point where the detection value reaches 100 for the tenth time, the temperature increase in the temperature increase portion reaches 80 K. In the case of FIG. 5, therefore, setting the threshold at 100 and reducing or stopping the laser light output when the detection value exceeds the threshold 10 times within a predetermined time period (in this case, 0.2 sec) is thought to be an appropriate setting. However, when the pulse width slightly narrows, as shown in FIG. 6, the laser light output is reduced or stopped even though the temperature increase in the temperature increase portion has reached only approximately 63 K, and conversely, when the pulse width slightly widens, as shown in FIG. 7, the temperature increase in the temperature increase portion reaches 80 K in response to the initial pulse and reaches approximately 94 K in response to the tenth pulse, meaning that the temperature increase portion may be damaged. Likewise in this case, therefore, setting cannot be performed so as to prevent both damage to the temperature increase portion and unnecessary reduction or stoppage of the laser light output.

In FIGS. 3 to 7, for the purpose of clarity, the heat inflow amount and the detection value of the light detecting means 5 are shown to vary regularly. In reality, however, reflection light varies in a number of different ways over time, and therefore the heat inflow amount and the detection value of the light detecting means also vary. Moreover, it may be the case that the location damaged by the temperature increase is always the same, but when a plurality of locations are damaged by the temperature increases, the respective thermal capacities, thermal resistances, and heat resistance upper limit values thereof differ dependent on respective temperature increase portions, and it is therefore clearly impossible to perform setting to prevent both damage to the temperature increase portion and unnecessary reduction or stoppage of the laser light output only on the basis of the detection result from the light detecting means 5, as in the prior art.

Next, a method for effectively controlling the temperature of each of the temperature increase portions to or below the second predetermined temperature by switching the optical output command to the emergency optical output command on the basis of the temperature of the temperature increase portion, calculated by the temperature calculation unit 7, as required, or in other words when the temperature of the temperature increase portion exceeds the second predetermined temperature or is about to exceed the second predetermined temperature, will be described.

Figure 8:
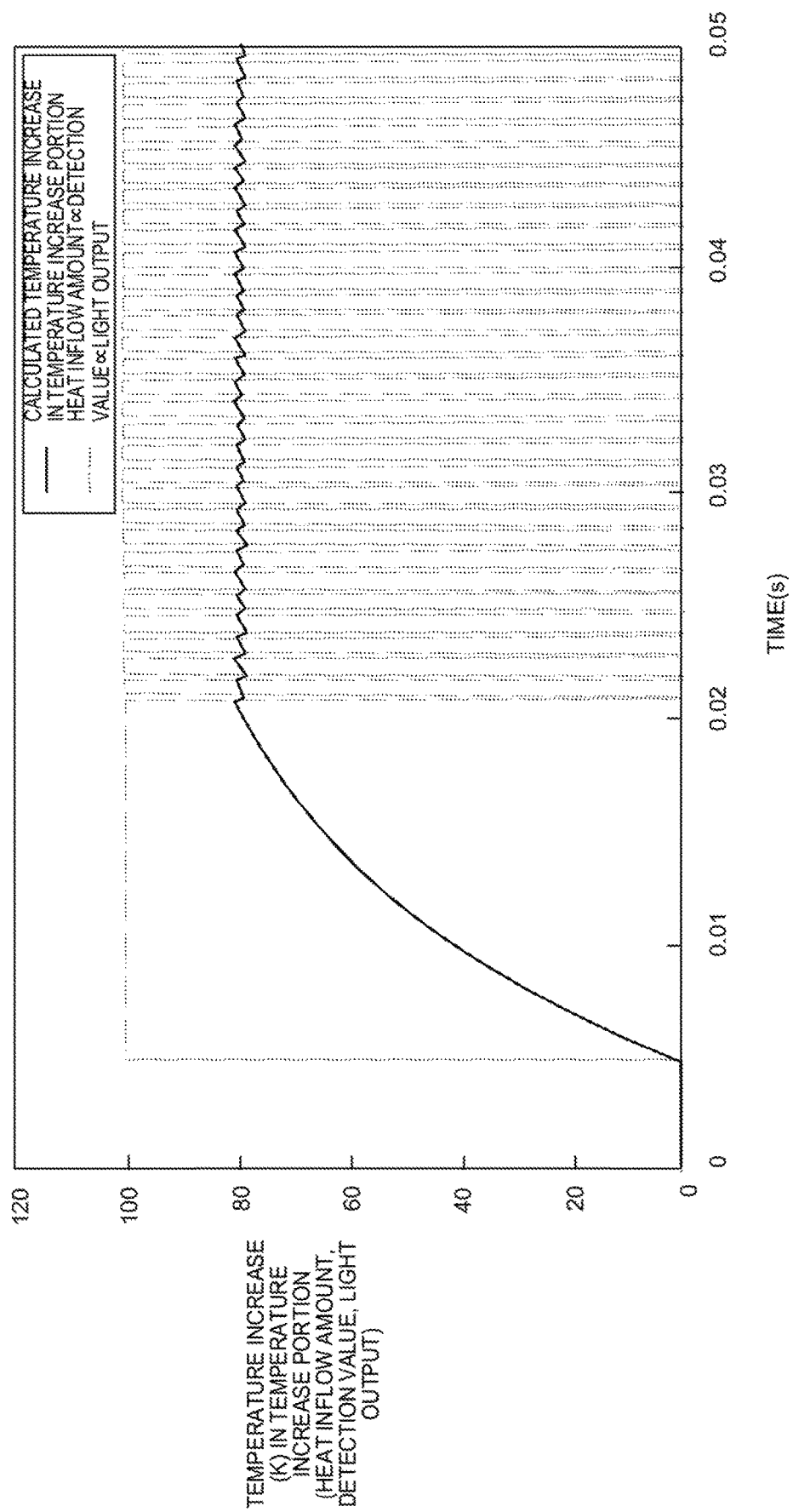
FIG. 8 is a view showing an example of variation in the temperature increase in the temperature increase portion in a case where light output is controlled by feeding back the calculated temperature increase in the temperature increase portion.

In the simplest method, the emergency command determination unit 8 determines the emergency optical output command on the basis of a control method for feedback-controlling the laser light output with respect to the temperature of each temperature increase portion, or the temperature of each temperature increase portion and the transition thereof, using at least the temperatures of the respective temperature increase portions, calculated by the temperature calculation unit 7, as input data. FIG. 8 shows an example of control results acquired by this feedback control.

In FIG. 8, similarly to FIGS. 6 and 7, the thick solid lines indicate the temperature increase in the temperature increase portion, while the thin dotted lines denote values acquired by multiplying the heat inflow amount by 5, albeit using a different unit, so that 100 on the scale of the vertical axis indicates a heat inflow amount of 20 W. Note that even when the light output is constant, the intensity of the reflection light varies, leading to variation in the detection value acquired by the light detecting means and variation in the heat inflow amount. To simplify the description, however, it is assumed that the light output and the detection value acquired by the light detecting means 5 both have a proportional relationship with the heat inflow amount, and therefore the light output and the detection value acquired by the light detecting means 5 are denoted by the same narrow dotted lines as the heat inflow amount. The thermal property parameters of the temperature increase portion in which the temperature increase is calculated are identical to those shown in FIGS. 3 to 7, and feedback control is performed such that when the temperature increase in the temperature increase portion exceeds 80 K, an emergency optical output command for stopping the light output for 0.2 milliseconds is executed to ensure that the temperature increase in the temperature increase portion substantially does not exceed 80 K. In this case, to minimize the occurrence of machining defects, the temperature increase in the temperature increase portion is prevented from exceeding 80 K by stopping light output momentarily, without varying the peak light output, but control for reducing the peak light output or the like may also be executed.

Feedback control is a simple control method, meaning that the load on the emergency command determination unit 8 is small, and therefore the emergency optical output command can be determined substantially at the same time as the temperature of the temperature increase portion is calculated. As a result, countermeasures can be taken quickly when the temperature of the temperature increase portion exceeds the second predetermined temperature. By applying PID control, it is also possible to prevent the temperature of the temperature increase portion from overshooting and exceeding the second predetermined temperature by a large amount.

In another control method, the emergency command determination unit 8 may predict the transition of the temperature of each temperature increase portion following a certain point in time from at least the transition of the temperature increase in the temperature increase portion up to a point in time, as calculated by the temperature calculation unit 7, and the optical output command that is either currently being output or about to be output by the control unit 6, and determine the emergency optical output command by referring to the predicted transition of the temperature of each temperature increase portion. By executing feedforward control while referring to the predicted transition of the temperature of the temperature increase portion, it is possible to predict that the temperature of the temperature increase portion will exceed the second predetermined temperature, and determine and output the emergency optical output command, at an earlier stage, and as a result, the likelihood that the temperature of the temperature increase portion will greatly exceed the second predetermined temperature can be reduced.

Figure 9:
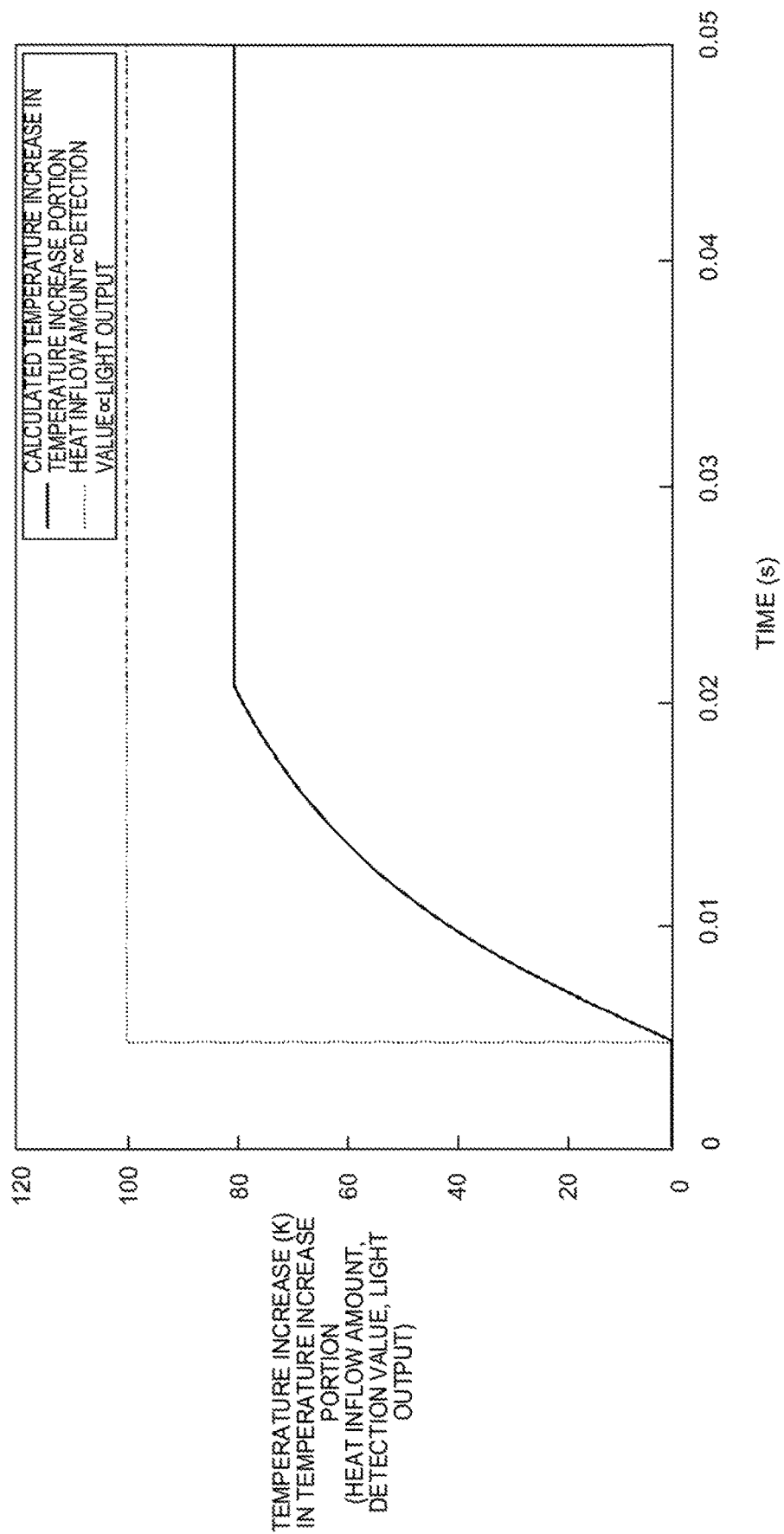
FIG. 9 is a view showing an example of variation in the temperature increase in the temperature increase portion in a case where an optical output command is read in advance, the transition of the temperature increase in the temperature increase portion is predicted, and the light output is controlled on the basis of the prediction result.

FIG. 9 shows an example of a case in which the optical output command about to be output is read in advance, the transition of the temperature of the temperature increase portion is predicted, and the emergency optical output command is determined by referring to the predicted transition of the temperature of the temperature increase portion.

In FIG. 9, the thermal property parameters of the temperature increase portion and the meanings of the thick solid lines and thin dotted lines are the same as in FIG. 8. In this control method, the temperature increase in the temperature increase portion is controlled precisely to 80 K by reading the optical output command about to be output in advance, predicting the temperature increase in the temperature increase portion, and executing the emergency optical output command, in which an optical output command for stopping the light output for 0.02 milliseconds has been inserted at an appropriate time interval, without varying the peak light output so that the temperature increase in the temperature increase portion is controlled to 80 K. Note that when the short, 0.02 millisecond light output stoppage described above is plotted on the graph as is, the intervals between the lines on the graph become narrow, making the figure difficult to understand, and therefore the part of FIG. 9 indicated by a thin dot-dash line denotes the part from which the lines on the graph have been omitted. According to this control method, oscillation in the temperature increase in the temperature increase portion can be reduced in comparison with the control method having the control results shown in FIG. 8. Moreover, the light output stoppage time is short, and therefore the likelihood of machining defects can also be further reduced.

A control method in which the temperature increase in the temperature increase portion is reduced below 80 K instead of being controlled to 80 K or the vicinity thereof when the temperature increase in the temperature increase portion reaches the vicinity of or exceeds 80 K may of course also be considered, but with this method, the likelihood of machining defects increases, and therefore, as long as the temperature increase in the temperature increase portion can be controlled precisely, the light output or the average light output is preferably not reduced more than necessary, as in the control methods illustrated in FIGS. 8 and 9.

Note, however, that an abnormal phenomenon such as an extremely large amount of reflection light suddenly being generated may occur when the temperature of the temperature increase portion, calculated by the temperature calculation unit 7 with respect to each of the temperature increase portions, has reached the first predetermined temperature or exceeded the first predetermined temperature. In this case, in order to minimize damage to the laser apparatus 1, light output of the laser light is preferably stopped immediately on the judgment of the control unit 6, without waiting for the emergency optical output command to be output.

Note that in order to accurately predict the transition of the temperature of each temperature increase portion following execution of the optical output command, it is necessary to perform analysis taking into account not only the optical output command and the temperature of the temperature increase portion, but also the state of the laser apparatus 1, the state of the workpiece, and so on, and therefore machine learning may also be applied to predict the transition of the temperatures of the respective temperature increase portions relative to the state of the laser apparatus 1, including the optical output command. A method of applying machine learning to prediction of the transition of the temperatures of the respective temperature increase portions relative to the state of the laser apparatus 1, including the optical output command, will be described later.

Second Embodiment

Figure 10:
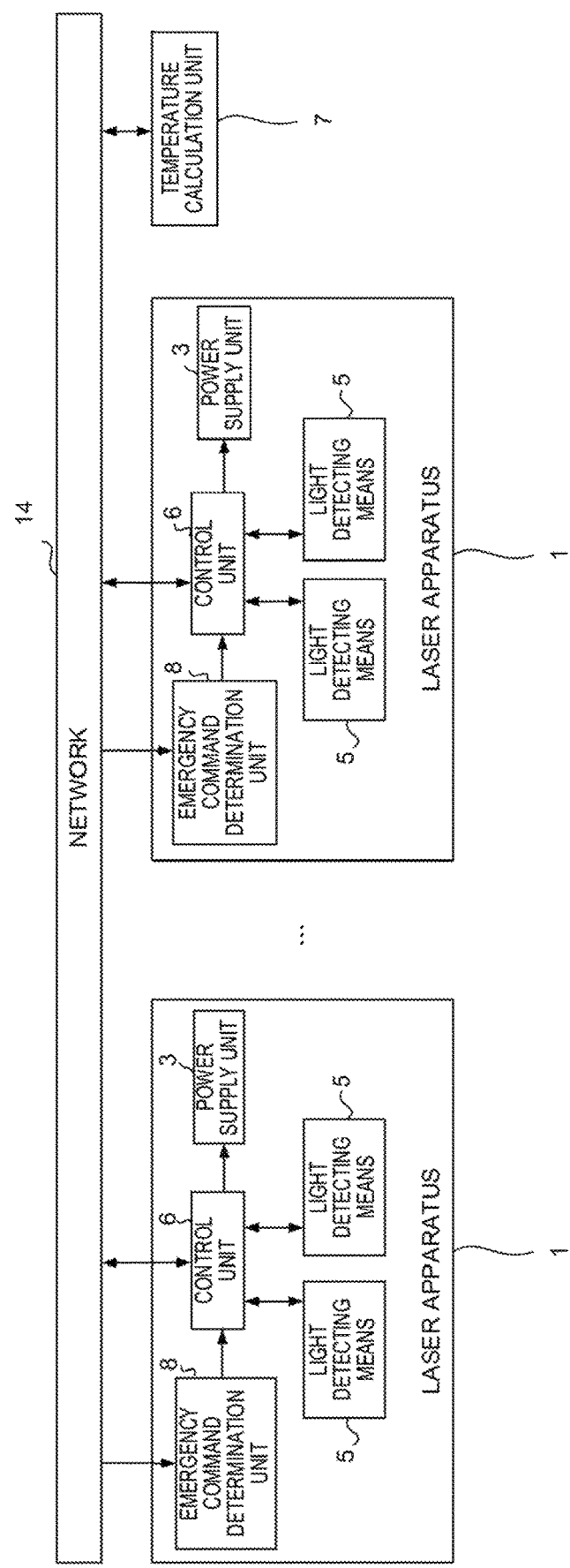
FIG. 10 is a block diagram showing a conceptual configuration of a laser apparatus according to a second embodiment of the present invention.

FIG. 10 is a block diagram showing a conceptual configuration of a laser apparatus according to a second embodiment of the present invention.

The laser apparatus 1 is connected to a network 14 together with the temperature calculation unit 7 and shares the temperature calculation unit 7 with a separate plurality of laser apparatuses 1 within the same cell, these laser apparatuses 1 also being connected to the network 14. The temperature calculation unit 7 may not be included in any of the laser apparatuses 1, as shown in FIG. 10, or may be disposed in one of the laser apparatuses 1, as shown in FIG. 1. In block diagrams showing conceptual configurations from FIG. 10 onward, constituent blocks of the laser apparatus 1 such as the laser oscillator 2 and the laser optical system 4 have been omitted.

In this embodiment, as shown in FIG. 10, equipment costs can be reduced by sharing the temperature calculation unit, which requires high-speed computing power in the order of microseconds, among a plurality of laser apparatuses. Further, by limiting the laser apparatuses that are connected to the shared temperature calculation unit over the network to laser apparatuses within the same cell, the temperature calculation unit can function as an edge computer such that the calculation results acquired by the temperature calculation unit can be transmitted to the control units and emergency command determination units of the laser apparatuses with substantially no time delay caused by communication or the like, and as a result, a delay in switching to the emergency optical output command and subsequent damage to the laser apparatuses can be prevented. As regards the number of laser apparatuses 1 connected to the network within the same cell, a range of several apparatuses to several tens of apparatuses is generally considered appropriate, but this embodiment is not limited to this range.

Third Embodiment

Figure 11:
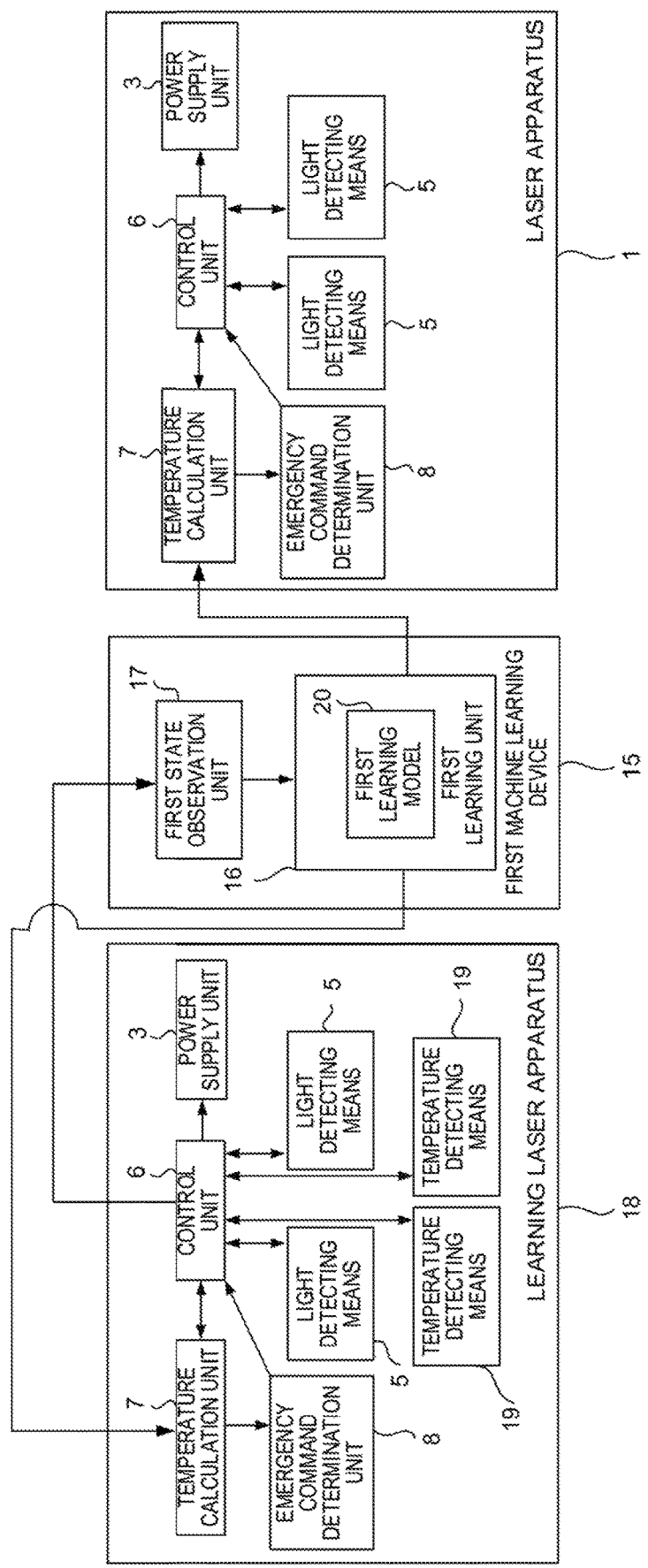
FIG. 11 is a block diagram showing a conceptual configuration of a laser apparatus according to a third embodiment of the present invention.

FIG. 11 is a block diagram showing a conceptual configuration of a laser apparatus according to a third embodiment of the present invention.

The temperature calculation unit 7 is connected communicably to a first learning unit 16 of a first machine learning device 15. With respect to at least one of the respective temperature increase portions of the laser apparatus 1, the first learning unit 16 learns, by machine learning, at least one of either a formula from which a physical quantity can be calculated or a physical quantity, among a heat inflow amount formula such as formula (5), which includes the detection value from at least one of the light detecting means 5 as a function and from which the heat inflow amount flowing into the temperature increase portion can be calculated, the thermal capacity of the temperature increase portion, and the thermal resistance from the temperature increase portion to the temperature fixed point. The temperature calculation unit 7 calculates the temperature of the temperature increase portion by referring to the learning result acquired by the learning unit 16, the learning result being obtained from the first learning unit 16 and recorded in the temperature calculation unit 7.

Approximate values of the thermal capacities and thermal resistances of the respective temperature increase portions can be determined from material property values, thermal analysis, and so on, although there is no guarantee of precision therein, and therefore, by performing repeated tests, it is possible to determine the heat inflow amount flowing into the temperature increase portion as a formula such as formula (5), which uses the detection value acquired by the light detecting means 5 as a function. Because it is difficult to control the amount of reflection light while emitting laser light, however, it is difficult to control the test conditions, and as a result, a lot of man-hours is required to determine the function with a favorable degree of precision. For this reason, these physical quantities are learned by machine learning, i.e. without human intervention, and the acquired learning results are used. Likewise with regard to the thermal capacities and thermal resistances of the respective temperature increase portions, by correcting, through machine learning, the approximate values determined from the material property values, thermal analysis, and so on, formula (3), or in other words the temperature increase in the temperature increase portion, can be calculated more accurately.

A specific learning method used to acquire the aforesaid learning results will be described below. The first machine learning device 15 includes a first state observation unit 17. At least during a learning period, the first state observation unit 17 is connected communicably to the control unit 6 of a learning laser apparatus 18 that is set up to be capable of measuring the temperature of at least one of the temperature increase portions using the temperature detecting means 19 and that executes the optical output command in accordance with a learning optical output command program.

Normal contact-type temperature detecting means, a thermography device (an infrared camera) capable of remotely sensing a two-dimensional temperature distribution, and so on may be used as the temperature detecting means 19. As a rule, the temperature detecting means 19 is disposed only in the learning laser device 18 and does not have to be disposed in the mass-produced laser apparatus 1. However, the temperature detecting means 19 may be disposed in a temperature increase portion that is low in cost and easy to perform temperature measurement on, and the result of actually measuring the temperature of this temperature increase portion may be used additionally to determine the emergency optical output command. Further, data output from a sensor for measuring a state that may affect the temperature of the temperature increase portion, for example an external temperature sensor for measuring the temperature on the periphery of the learning laser apparatus 18 or the like, is also preferably included in the state data observed by the first state observation unit 17.

The first state observation unit 17 acquires internal data from the learning laser apparatus 18, such as the optical output command, the detection values from the respective light detecting means 5, and the measurement results indicating the temperatures of the respective temperature increase portions, acquires data from the external sensor or the like, processes the data as required, and outputs the processed data to the first learning unit 16.

The first learning unit 16 learns a model relating to the regularity of the state data of the learning laser apparatus 18, including at least the detection results acquired by the light detecting means 5 and the measurement results acquired by the temperature detecting means 19 in relation to the temperatures of the temperature increase portions, and as a learning result, constructs for each temperature increase portion a first learning model 20 including the heat inflow amount flowing into the temperature increase portion, which can be calculated as a function of the detection values acquired by the light detecting means 5, the thermal capacity of the temperature increase portion, and the thermal resistance from the temperature increase portion to the temperature fixed point. In other words, the first learning model 20 for learning the regularity of a large amount of input data, i.e. the values of $C_i$ and $R_i$ in formula (3) and the values of the coefficients such as $a_{ijk}$ and $b_{ik}$ and the constant $c_i$ in formula (5) at which the closest match to the measurement result of the temperature increase in the temperature increase portion is acquired, can be machine-learned with respect to the input data using an unsupervised learning algorithm, for example. Then, by referring to the learning result, laser apparatuses 1 other than the learning laser apparatus 18 can calculate the temperature of each temperature increase portion without human intervention.

Figure 12:
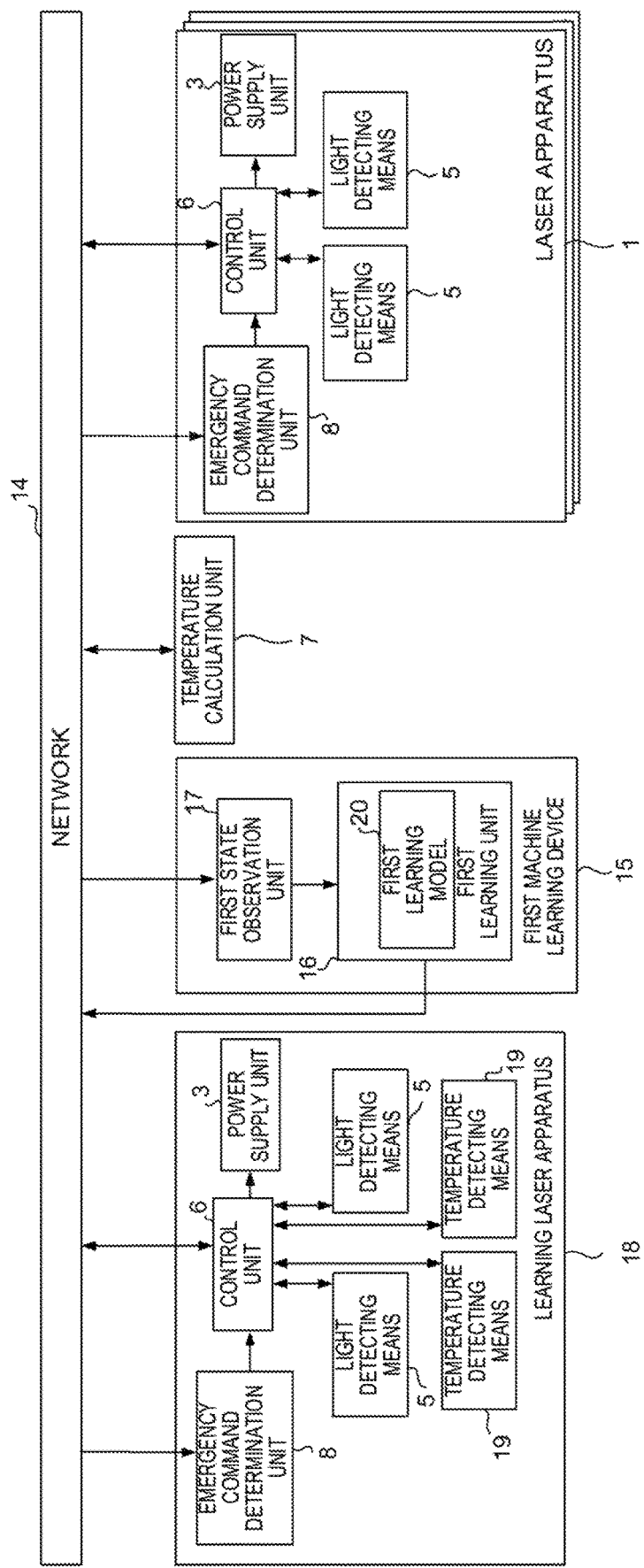
FIG. 12 is a block diagram showing another conceptual configuration of the laser apparatus according to the third embodiment of the present invention.

Note that the temperature calculation unit 7 and the first learning unit 16 of the first machine learning device 15, as well as the first state observation unit 17 of the first machine learning device 15 and the control unit 6 of the learning laser apparatus 18, may be connected communicably over the network 14, as shown in FIG. 12. Further, as also shown in FIG. 12, the temperature calculation unit 7 may be shared by the learning laser apparatus 18 and a plurality of laser apparatuses 1 other than the learning laser apparatus 18 over the network 14. Moreover, the learning laser apparatus 18 may be disconnected from the first machine learning device 15 or the network for periods other than the learning or after completion of learning, and the first machine learning device 15 may be disconnected from the laser apparatuses 1 or the network 14 after the learning result learned thereby has been output to the temperature calculation units 7 of the laser apparatuses 1 other than the learning laser apparatus 18 and recorded in the temperature calculation units 7.

In order to control the reflection light detection value when machine-learning the first learning model 20 relating to regularity and so on by acquiring a large amount of data while varying the laser light output and the reflection light detection conditions, the measurement of the temperature of the temperature increase portion may be repeated by varying systematically the peak value of the pulse, the pulse width, the pulse period, and so on, while moving the relative positions of the machining head 9 with respect to the workpiece 12 at a constant speed in a parallel direction to the surface of the workpiece 12, using the drive unit 13. When pulse light is output while moving the relative positions of the machining head 9 with respect to the workpiece 12 at a constant speed, the laser light is always emitted onto a new position on the surface of the workpiece 12, and therefore substantially identical reflection light is returned in response to a pulse having the same waveform. As a result, data can be acquired while controlling the reflection light detection value.

Fourth Embodiment

Figure 13:
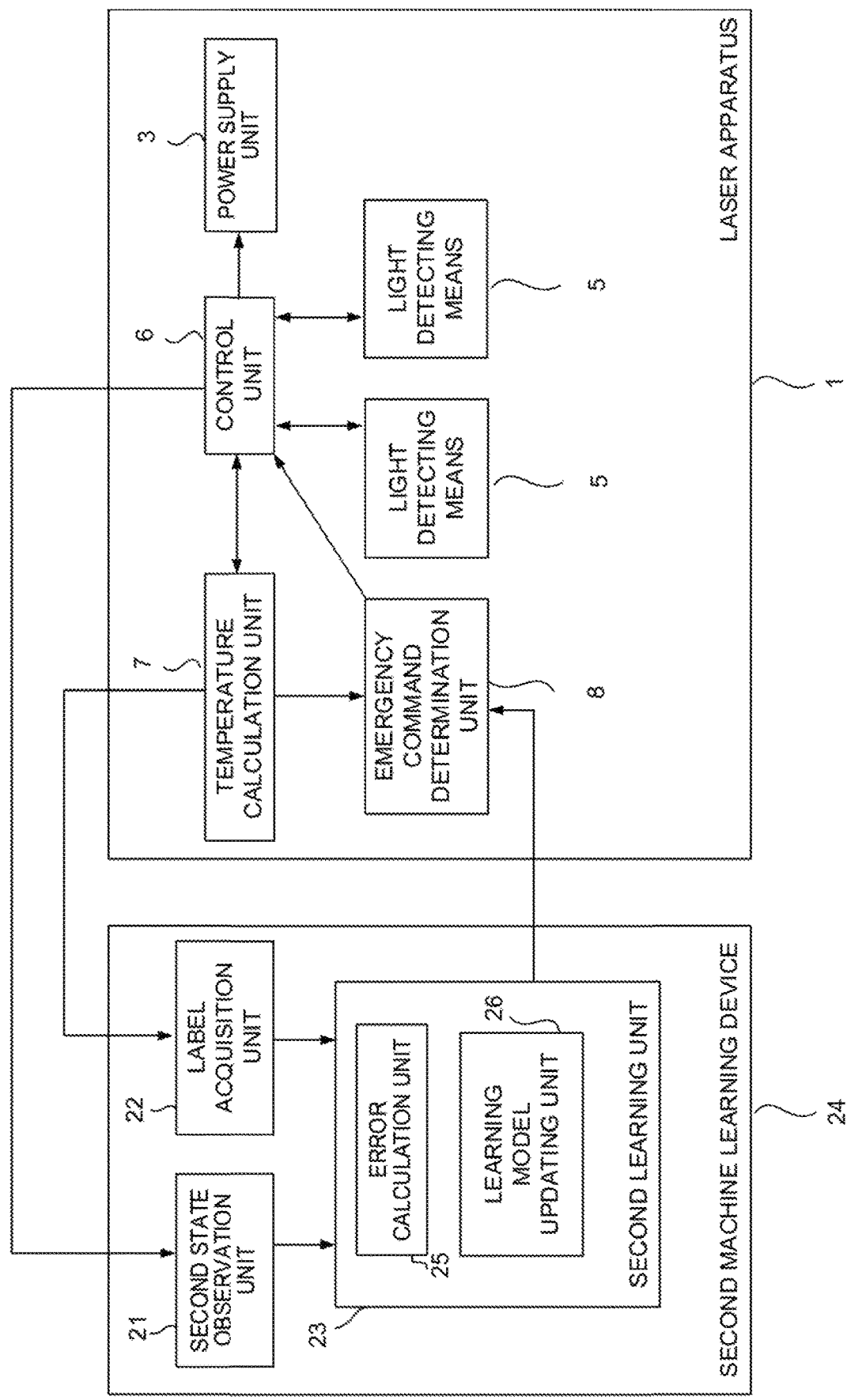
FIG. 13 is a block diagram showing a conceptual configuration of an example of a laser apparatus according to a fourth embodiment of the present invention.
Figure 14:
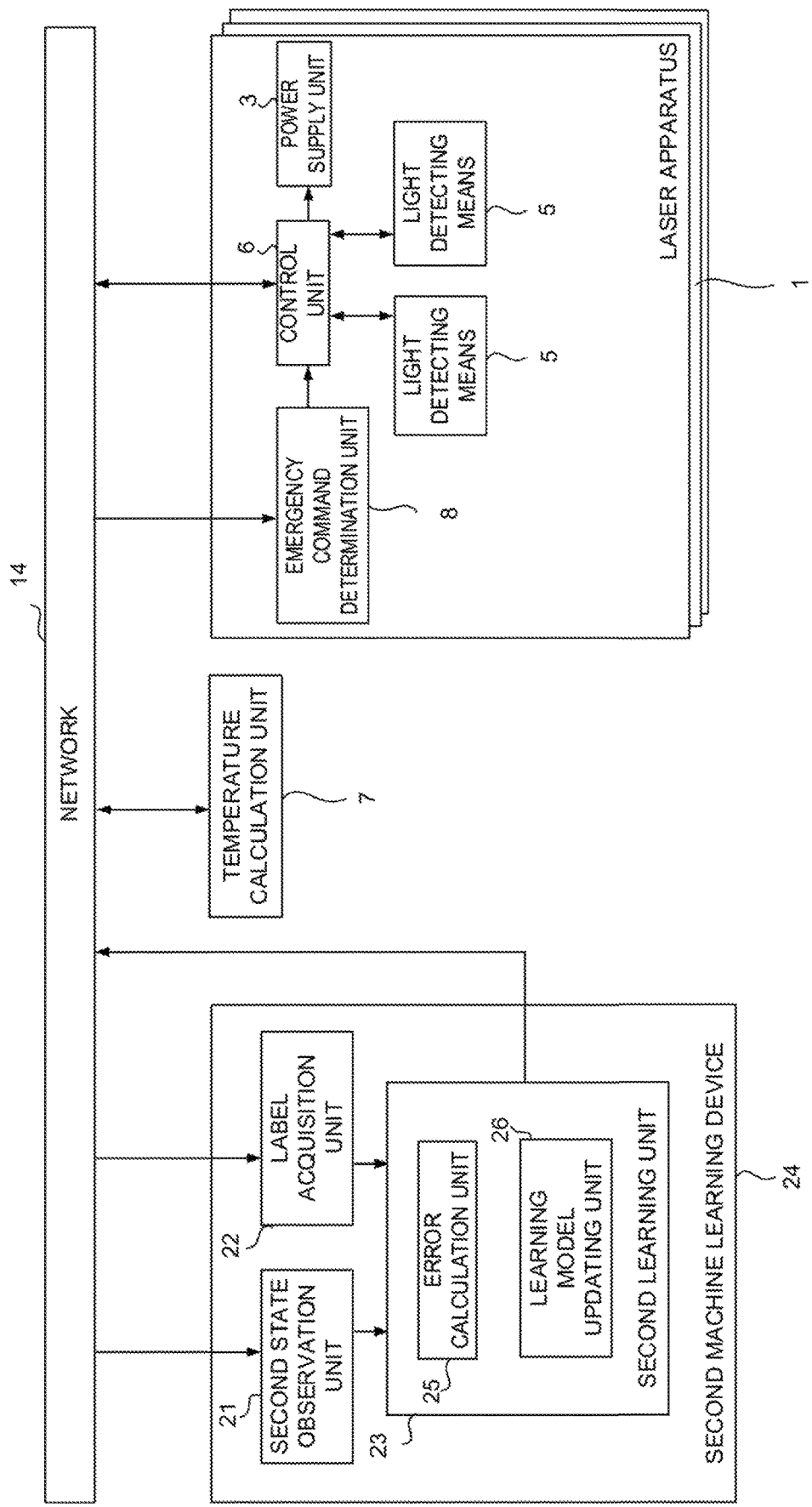
FIG. 14 is a block diagram showing a conceptual configuration of another example of the laser apparatus according to the fourth embodiment of the present invention.

FIGS. 13 and 14 are block diagrams showing a conceptual configuration of a laser apparatus according to a fourth embodiment of the present invention.

The control unit 6 of the laser apparatus 1 is connected communicably to a second machine learning device 24 having a second state observation unit 21, a label acquisition unit 22, and a second learning unit 23. The laser apparatus in FIG. 14 differs from the laser apparatus in FIG. 13 in that in the former, the laser apparatus 1 and the second machine learning device 24 are connected communicably via the network 14, and the temperature calculation unit 7 is shared by a plurality of laser apparatuses 1.

As shown in FIG. 13 or 14, the second state observation unit 21 observes state data expressing the state of the laser apparatus 1, including at least the optical output command, processes the observed state data as required so that the data can be used easily by the second learning unit 23, and then outputs the data to the second learning unit 23 as input data. In addition to the optical output command, the state data expressing the state of the laser apparatus 1 include internal data of the laser apparatus 1, such as the detection results obtained by the light detecting means 5, the temperatures at the respective temperature fixed points, optical characteristics of the laser optical system 4, and a drive command issued to the drive unit 13 to vary the relative positions of the machining head 9 with respect to the workpiece 12, and also preferably include data affecting the amount of reflection light propagating through the laser optical system 4 in the opposite direction to the laser light and data that are affected by the amount of reflection light, for example data from an external sensor (not shown) such as a temperature sensor for measuring the temperature on the periphery of the laser apparatus 1, and data relating to the workpiece 12, such as the material, thickness, size, and surface processing conditions of the workpiece 12.

The label acquisition unit 22 acquires, as a label, time series data corresponding to the input data and relating to the calculated temperature of each of the temperature increase portions, calculated by the temperature calculation unit 7, and outputs the acquisition result to the second learning unit 23.

The second learning unit 23 includes an error calculation unit 25 and a learning model updating unit 26. The second learning unit 23 learns the relationship between the input data and the label and constructs a second learning model in order to represent the label from the input data. The error calculation unit 25 calculates an error in the label represented relative to newly inputted input data on the basis of the constructed second learning model. The learning model updating unit 26 updates the second learning model in accordance with the error. The second learning unit 23 advances learning by repeatedly updating the second learning model.

At a point where learning by the second learning unit 23 has advanced to at least a certain extent, the emergency command determination unit 8 predicts the transition of the calculated temperature of each temperature increase portion in relation to the optical output command from the control unit 6 by referring to the learning result acquired by the second learning unit 23 while taking the state of the laser apparatus 1 into consideration. The emergency command determination unit 8 then determines and outputs the emergency optical output command as required so as to ensure that the temperature of the temperature increase portion does not exceed the second predetermined temperature. The learning result acquired by the second learning unit 23 may be recorded in the emergency command determination unit 8 so that the emergency optical output command can be determined at a higher speed. After the learning result acquired by the second learning unit 23 has been recorded in the emergency command determination unit 8, the second machine learning device 24 may be disconnected from the laser apparatus 1.

Figure 15:
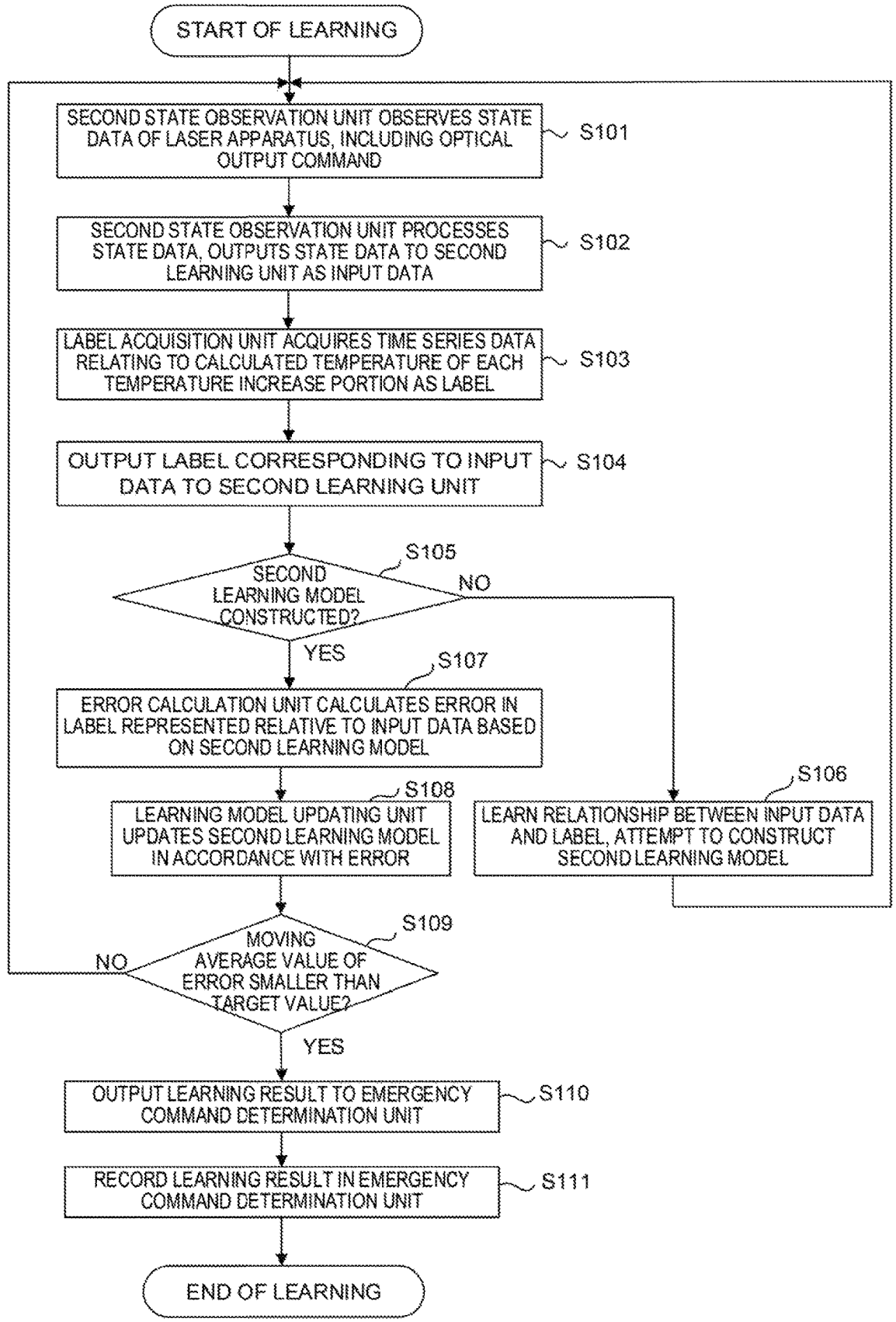
FIG. 15 is a flowchart showing an example of a learning process up to a point where a second machine learning device outputs a learning result to the laser apparatus shown in FIG. 13 or 14.

FIG. 15 is a flowchart showing an example of specific learning processes employed by the second machine learning device 24 according to this embodiment and processes in which the learning result is used.

As shown in FIG. 15, when a learning operation (learning processing) is started in the second machine learning device 24 shown in FIG. 13 or 14, the second state observation unit 21 observes the state data of the laser apparatus 1, including the optical output command (step S101), processes the observed state data as required so that the data can be used easily by the second learning unit 23, and then outputs the data to the second learning unit 23 as input data (step S102). Meanwhile, the label acquisition unit 22 acquires, as a label, time series data corresponding to the input data and relating to the calculated temperature of each of the temperature increase portions, calculated by the temperature calculation unit 7 (step S103), and outputs the label corresponding to the input data to the second learning unit 23 (step S104).

Next, the second learning unit 23 determines whether or not the second learning model has already been constructed (step S105), and after determining that even an initial model of the second learning model has never been constructed, the second learning unit 23 attempts to construct an initial model of the second learning model by learning the relationship between the input data and the corresponding label (step S106). The processing then returns to step S101, where a further pair of a large amount of input data and a corresponding label is input.

When, on the other hand, it is determined in step S105 that the second learning model has been constructed, the error calculation unit 25 calculates the error in the label represented relative to the newly inputted input data on the basis of the constructed second learning model (step S107), whereupon the learning model updating unit 26 updates the second learning model in accordance with the error (step S108).

Next, in order to determine whether or not the learning result has reached a target level, in the example flowchart shown in FIG. 15, a determination is made as to whether or not a moving average value of the error in the label relative to a predetermined amount of the most recent input data is smaller than a target value (step S109). When the moving average value of the error is determined not to be smaller than the target value, the processing returns to step S101, from which learning is continued by repeating steps S101 to S108. When, on the other hand, it is determined in step S109 that the moving average value of the error is smaller than the target value, the second learning unit 23 outputs the learning result to the emergency command determination unit 8 of the laser apparatus 1 (step S110). The learning result received by the emergency command determination unit 8 is recorded in the emergency command determination unit 8 (step S111), whereupon the learning operation is terminated.

When the laser apparatus 1 is in a certain state, the manner in which the temperature of the temperature increase portion varies in response to the optical output command can be determined approximately by assuming that the amount of reflection light is proportionate to the laser light output at that point in time. However, the amount of reflection light is affected by various conditions, and therefore this assumption does not always match reality. Hence, when the manner in which the temperature of the temperature increase portion varies in response to the optical output command is predicted, the precision of the prediction is low. Moreover, when the manner in which the temperature of the temperature increase portion varies in response to the optical output command is determined by performing tests and the like with respect to cases in which the laser apparatus 1 in various states, a lot of man-hours is required.

However, by determining the manner in which the temperature of the temperature increase portion varies in response to the optical output command when the laser apparatus 1 is in various states using machine learning, as described above, the temperature of the temperature increase portion with respect to the optical output command can be predicted precisely without human intervention.

More specifically, by setting the calculated temperature of the temperature increase portion as a label (correct answer data), inputting a large number of sample pairs of labels and input data expressing the state of the laser apparatus 1, including the optical output command, and constructing a learning model in order to represent the label from the input data through unsupervised learning, as in this embodiment, the calculated temperature of the temperature increase portion relative to the input data including the optical output command can be predicted comparatively easily.

Fifth Embodiment

Figure 16:
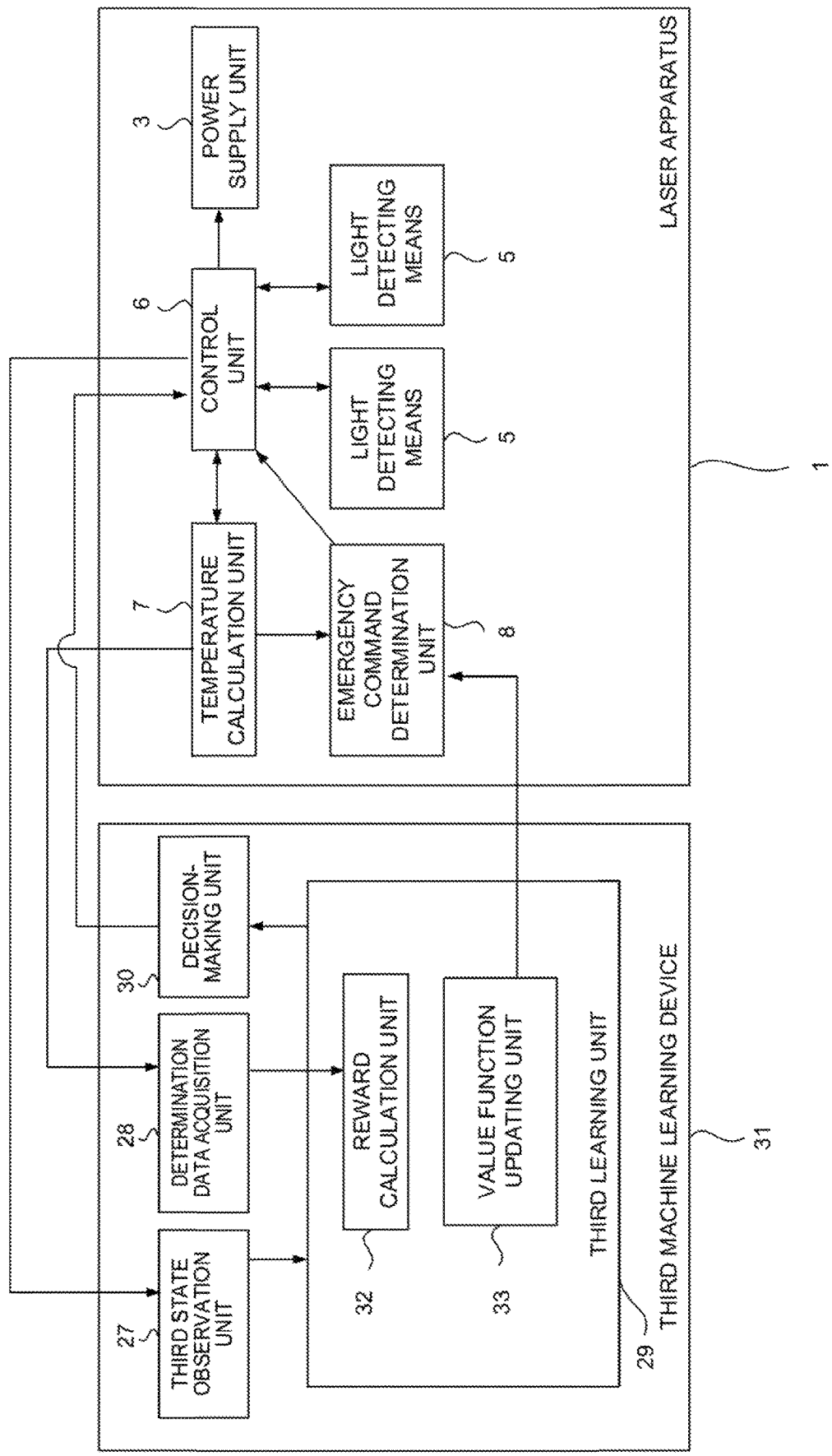
FIG. 16 is a block diagram showing a conceptual configuration of an example of a laser device according to a fifth embodiment of the present invention.
Figure 17:
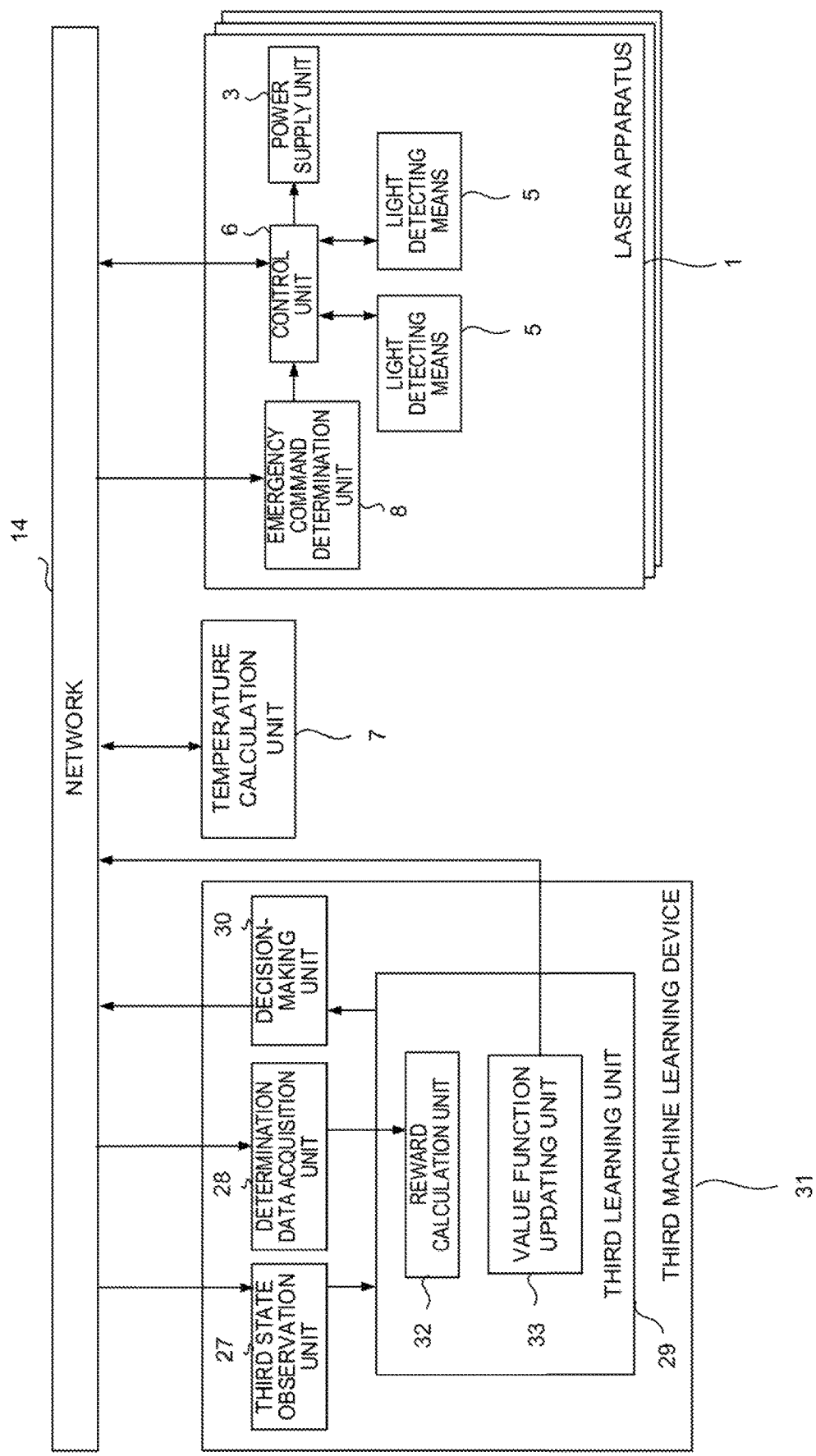
FIG. 17 is a block diagram showing a conceptual configuration of another example of the laser apparatus according to the fifth embodiment of the present invention.

FIGS. 16 and 17 are block diagrams showing conceptual configurations of a laser apparatus according to a fifth embodiment of the present invention.

The control unit 6 of the laser apparatus 1 is connected communicably to a third machine learning device 31 having a third state observation unit 27, a determination data acquisition unit 28, a third learning unit 29, and a decision-making unit 30. The third learning unit 29 includes a reward calculation unit 32 and a value function updating unit 33. The laser apparatus in FIG. 17 differs from the laser apparatus in FIG. 16 in that in the former, the laser apparatus 1 and the third machine learning device 31 are connected communicably via the network 14, and the temperature calculation unit 7 is shared by a plurality of laser apparatuses 1.

The third state observation unit 27 observes state data expressing the state of the laser apparatus 1 and including at least time series data relating to the optical output command up to a certain point in time and the calculated temperature of at least one of the temperature increase portions up to the same point in time. The third state observation unit 27 then processes the observed state data as required so that the data can be used easily by the third learning unit 29, and then outputs the data to the third learning unit 29 as input data. Similarly to the fourth embodiment described above, in addition to the optical output command, the state data expressing the state of the laser apparatus 1 include internal data of the laser apparatus 1, such as the detection results obtained by the light detecting means 5, the temperatures at the respective temperature fixed points, the optical characteristics of the laser optical system 4, and the drive command issued to the drive unit 13 to vary the relative positions of the machining head 9 with respect to the workpiece 12, and also preferably include data affecting the amount of reflection light propagating through the laser optical system 4 in the opposite direction to the laser light and data that are affected by the amount of reflection light, for example data from an external sensor (not shown) such as a temperature sensor for measuring the temperature on the periphery of the laser apparatus 1, and data relating to the workpiece 12, such as the material, thickness, size, and surface processing conditions of the workpiece 12.

The decision-making unit 30 refers to the learning result obtained by the third learning unit 29, and after predicting that the calculated temperature of the temperature increase portion will exceed the second predetermined temperature if the optical output command continues to be executed after the aforesaid point in time, determines an optical output command by which it is estimated that the calculated temperature of the temperature increase portion following the aforesaid point in time will be controlled to the second predetermined temperature.

While the laser apparatus 1 is being used for learning, the optical output command determined by the decision-making unit 30 is output to the control unit 6 of the laser apparatus 1, and in accordance with the optical output command output from the decision-making unit 30, the control unit 6 outputs the optical output command to the respective parts of the laser apparatus 1 to which the optical output command must be output, including the power supply unit 3 of the laser apparatus 1. In other words, while the laser apparatus 1 is being used for learning, the decision-making unit 30 assumes the functions of the emergency command determination unit 8 of the laser apparatus 1.

The determination data acquisition unit 28 acquires a difference between the calculated temperature of the temperature increase portion, i.e. the result obtained when the laser apparatus 1 executes the optical output command determined and output by the decision-making unit 30, and the second predetermined temperature, as determination data, and outputs the acquired determination data to the reward calculation unit 32 of the third learning unit 29.

Figure 18:
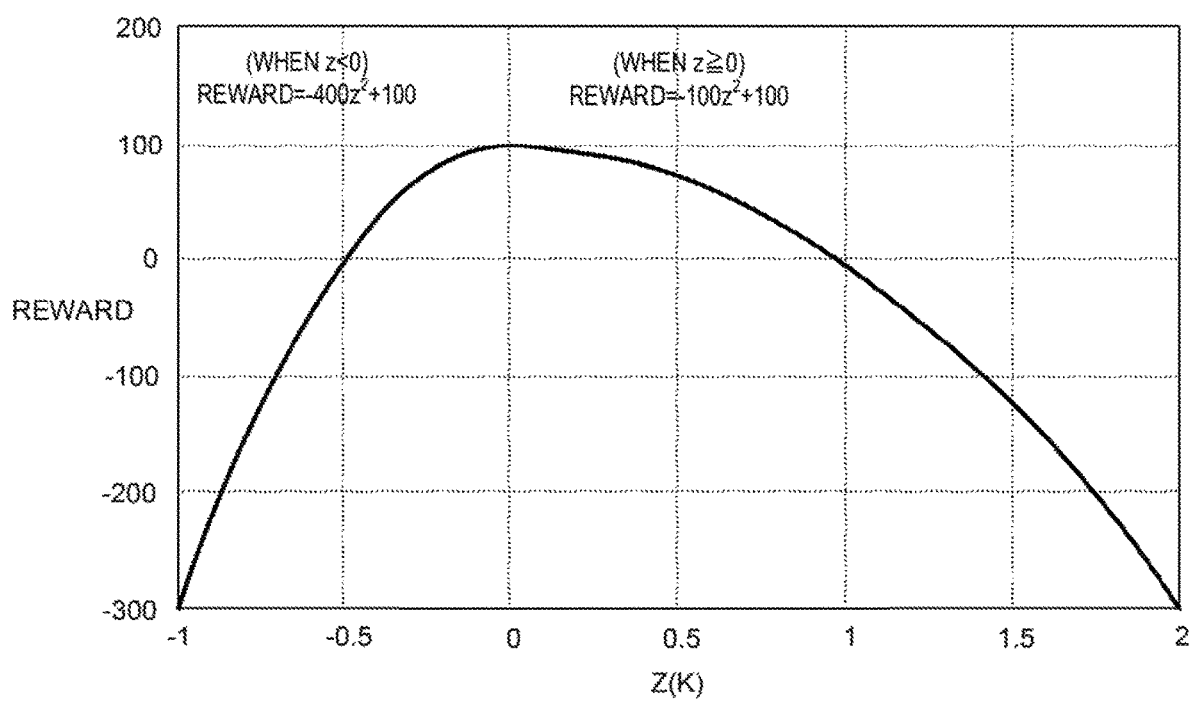
FIG. 18 is a view showing an example of a reward setting method used in the laser apparatus shown in FIG. 16 or 17.

The reward calculation unit 32 calculates either a positive reward or a negative reward in response to the determination data. For example, when it is predicted that the calculated temperature of a certain temperature increase portion will exceed the second predetermined temperature set in relation to that temperature increase portion and the optical output command is output so as to ensure that the calculated temperature of that temperature increase portion does not exceed the second predetermined temperature set in relation to that temperature increase portion, if a temperature difference obtained by subtracting the calculated temperature of the temperature increase portion, i.e. the result of the optical output command, from the second predetermined temperature set in relation to the temperature increase portion is set as $z(K)$, the reward may be expressed as a function of $z$ and set as shown in FIG. 18. The coefficients and indices of the function of $z$ are examples, but by setting the reward using the function and so on shown in FIG. 18, when $z<0$, or in other words when the calculated temperature of a certain temperature increase portion exceeds the second predetermined temperature set in relation to that temperature increase portion, the reward decreases rapidly as the absolute value of $z$ increases such that when $|z|$ reaches or exceeds 0.5 K, a negative reward is set. Conversely, when $z \geq 0$, or in other words when the calculated temperature of a certain temperature increase portion does not exceed the second predetermined temperature set in relation to that temperature increase portion, the reward decreases gradually as the absolute value of $z$ increases such that when $|z|$ is within 1 K, a positive reward is set. When the calculated temperature exceeds the second predetermined temperature, a large negative reward is set even at the same temperature difference of 1 K, for example, and therefore learning can be guided to ensure as far as possible that the calculated temperature does not exceed the second predetermined temperature.

The value function updating unit 33 updates a value function on the basis of the reward calculated by the reward calculation unit 32. By executing the processes described above repeatedly and repeatedly updating the value function, a feature extraction capability of the value function serving as the learning result of the third learning unit 29 improves, and as a result, an improvement is achieved in the precision with which the transition of the calculated temperature of the temperature increase portion with respect to the optical output command is predicted while taking various states of the laser apparatus 1 into account.

Once the precision with which the transition of the calculated temperature of each temperature increase portion is predicted has reached a target level, the value function serving as the learning result of the third learning unit 29 is output to the emergency command determination unit 8 of each laser apparatus 1, including the laser apparatus 1 that was used for learning, and the emergency command determination unit 8 records the value function. The emergency command determination unit 8 may predict the transition of the calculated temperature of each temperature increase portion with respect to the optical output command from the control unit by referring to the value function while taking various states of the laser apparatus 1 into account, and may then determine and output the emergency optical output command as required so as to ensure that the temperatures of the respective temperature increase portions do not exceed the respective second predetermined temperatures.

Figure 19:
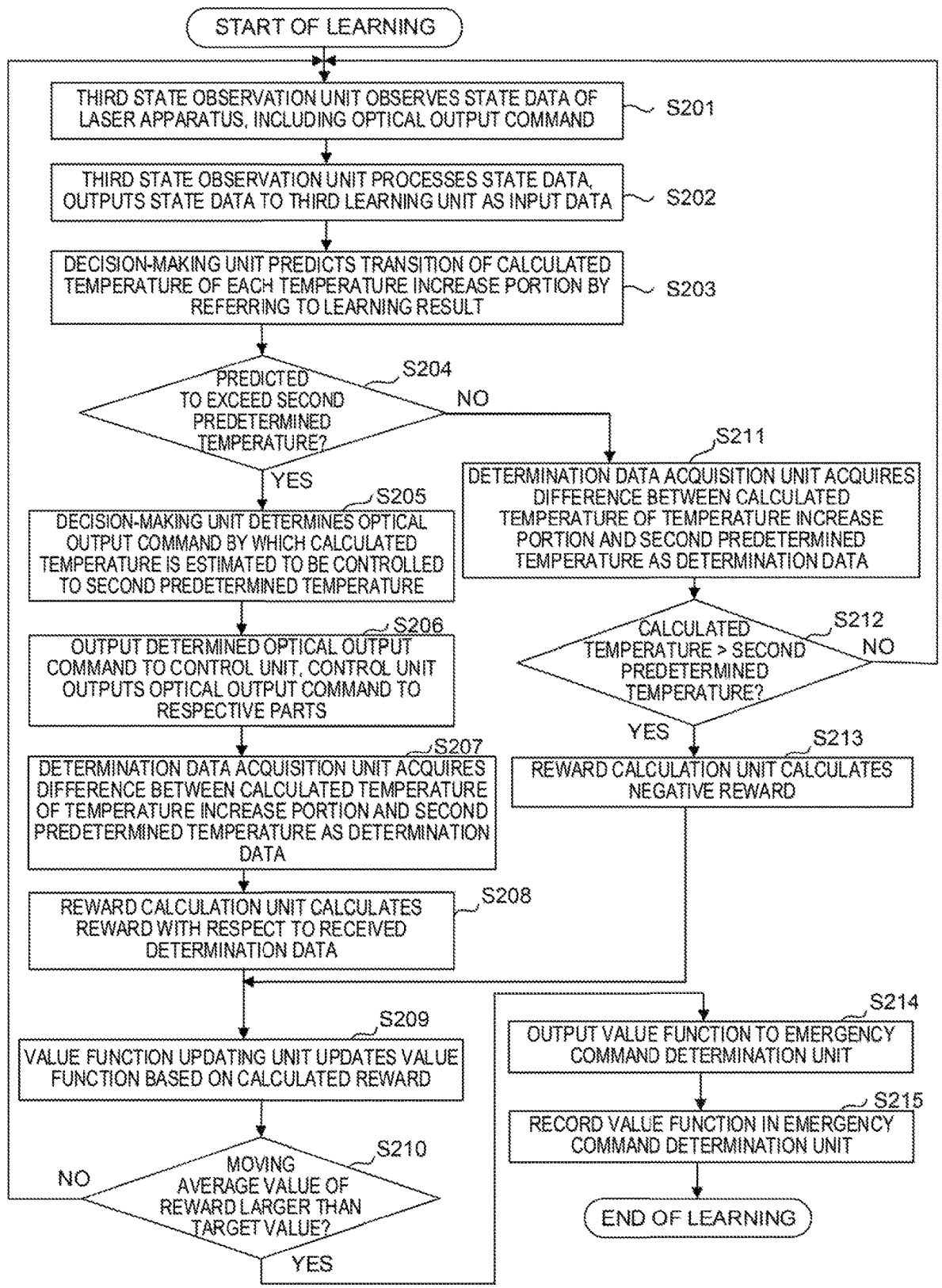
FIG. 19 is a flowchart showing an example of a learning process up to a point where a third machine learning device outputs a learning result to the laser apparatus shown in FIG. 16 or 17.

FIG. 19 is a flowchart showing an example of specific learning processes employed by the third machine learning device 31 according to this embodiment and processes in which the learning result is used.

As shown in FIG. 19, when a learning operation (learning processing) is started in the third machine learning device 31 shown in FIG. 16 or 17, the third state observation unit 27 observes the state data expressing the state of the laser apparatus 1 and including at least time series data of the optical output command up to a certain point in time and the calculated temperature of at least one of the temperature increase portions up to the same point in time (step S201). The third state observation unit 27 then processes the observed state data as required so that the data can be used easily by the third learning unit 29, and then outputs the data to the third learning unit 29 as the input data (step S202).

The decision-making unit 30 refers to the learning results obtained by the third learning unit 29 up to that point in order to predict the transition of the calculated temperature of each temperature increase portion when the previously set optical output command continues to be executed after the aforesaid point in time (step S203), and determines whether or not the calculated temperature of each temperature increase portion is predicted to exceed the second predetermined temperature (step S204).

When the calculated temperature of at least one of the temperature increase portions is predicted to exceed the second predetermined temperature, the decision-making unit 30 determines an optical output command by which it is estimated that the calculated temperature of the temperature increase portion following the aforesaid point in time will be controlled to the second predetermined temperature (step S205). The optical output command determined by the decision-making unit 30 is output to the control unit 6 of the laser apparatus 1, whereupon the control unit 6 outputs the optical output command output by the decision-making unit 30 to the respective parts of the laser apparatus 1 to which the optical output command must be output, including the power supply unit 3 of the laser apparatus 1, in accordance with the optical output command (step S206). The determination data acquisition unit 28 acquires the difference between the calculated temperature of the temperature increase portion, i.e. the result obtained when the laser apparatus 1 executes the optical output command determined and output by the decision-making unit 30, and the second predetermined temperature, as determination data (step S207).

The reward calculation unit 32 calculates a reward in response to the determination data received from the determination data acquisition unit 28 (step S208). As an example of calculation of a reward in response to the determination data, the reward setting method shown in FIG. 18, for example, may be employed. In this method, when it is predicted that the calculated temperature of a certain temperature increase portion will exceed the second predetermined temperature set in relation to that temperature increase portion and the optical output command is output so as to ensure that the calculated temperature of the temperature increase portion does not exceed the second predetermined temperature set in relation to the temperature increase portion, the temperature difference obtained by subtracting the calculated temperature of the temperature increase portion, i.e. the result of the optical output command, from the second predetermined temperature set in relation to the temperature increase portion is set as z(K).

The value function updating unit 33 updates the value function on the basis of the reward calculated by the reward calculation unit 32 (step S209).

Next, in order to determine whether or not the learning result has reached the target level, in the example flowchart shown in FIG. 19, a determination is made as to whether or not a moving average value of the most recent reward is larger than a target value (step S210). When the moving average value of the error is determined not to be smaller than the target value, the processing returns to step S201, in which learning is continued. When, on the other hand, it is determined in step S210 that the moving average value of the reward is larger than the target value, the value function serving as the learning result of the third learning unit 29 is output to the emergency command determination unit 8 of the laser apparatus 1 (step S214). The value function received by the emergency command determination unit 8 is then recorded in the emergency command determination unit 8 (step S215), whereupon the learning operation is terminated.

Following termination of the learning operation, the emergency command determination unit 8 predicts the transition of the calculated temperature of each temperature increase portion with respect to the optical output command from the control unit 6 by referring to the value function recorded therein while taking into account various states of the laser apparatus 1. The emergency command determination unit 8 then determines the emergency optical output command and outputs the emergency optical output command to the control unit 6 as required so as to ensure that the temperature of each temperature increase portion does not exceed the second predetermined temperature.

Figure 20:
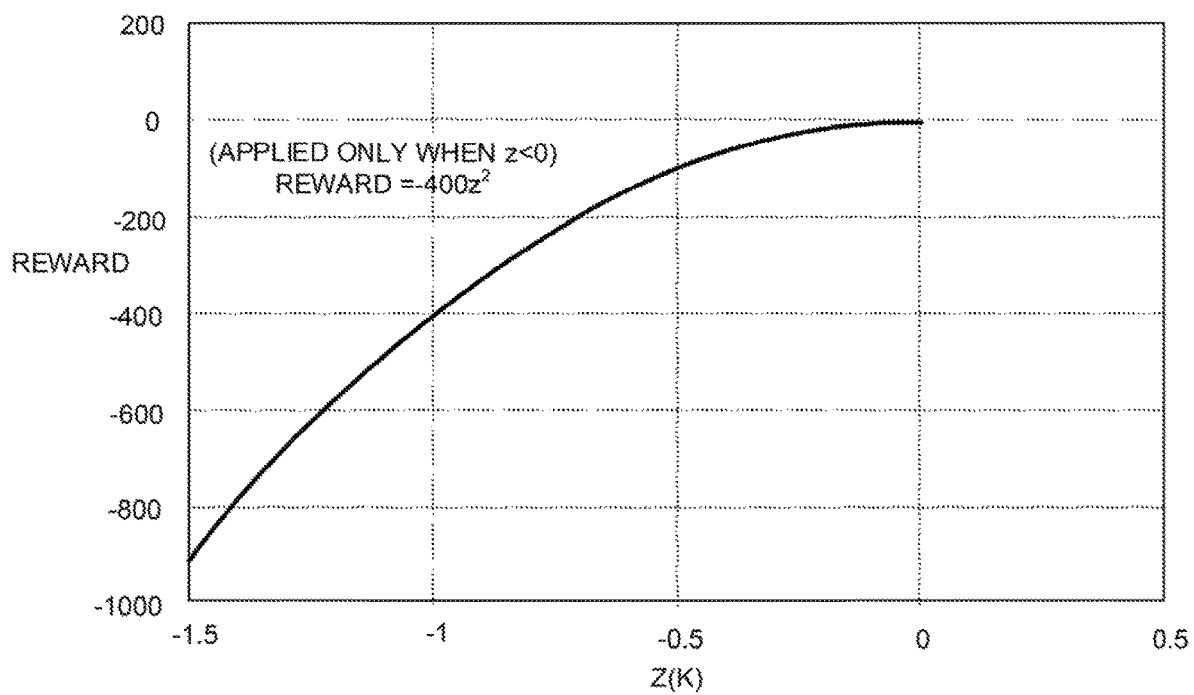
FIG. 20 is a view showing another example of the reward setting method used in the laser apparatus shown in FIG. 16 or 17.

Note that when it is predicted in step S204 that none of the calculated temperatures of the respective temperature increase portions will exceed the second predetermined temperatures set respectively in relation to the temperature increase portions, the processing may return to step S201. Alternatively, as shown on the flowchart in FIG. 19, the determination data acquisition unit 28 may acquire the difference between the calculated temperature of each temperature increase portion, i.e. the result of continuously executing the previously set optical output command, and the second predetermined temperature as the determination data (step S211), a determination may be made as to whether or not the calculated temperature of each temperature increase portion exceeds the second predetermined temperature (step S212), and when none of the calculated temperatures of the temperature increase portions exceed the second predetermined temperatures set respectively in relation to the temperature increase portions, the processing may return to step S201, whereas when the calculated temperature of at least one of the temperature increase portions exceeds the second predetermined temperature, or in other words when z(K) is z<0, the reward calculation unit 32 may calculate a negative reward (step S213) in accordance with a reward setting method shown in FIG. 20, for example, which is similar to the reward setting method shown in FIG. 18, whereupon the processing advances to step S209.

By executing steps S201 to S213 repeatedly and repeatedly updating the value function, the feature extraction capability of the value function serving as the learning result of the third learning unit 29 improves.

By executing reinforcement learning for learning, through trial and error, the optimum action (output of the emergency optical output command) to be performed by the laser apparatus 1 in each of various operating states on the basis of the determination data in order to cause the laser apparatus 1 to perform a target operation, as in this embodiment, an optical output command for controlling the temperature of a temperature increase portion to a target temperature can be output more precisely without human intervention under conditions in which the state of the laser apparatus varies.

Note that the above embodiments are used only to explain the present invention. Accordingly, the invention is not limited to these embodiments and may be subjected to various modifications. In the machine learning of the third to fifth embodiments, the learning result may also be shared among a plurality of machine learning devices over a network or the like. Furthermore, even when a damage mode other than the temperature increase described in the present invention exists as damage to the laser apparatus and the laser optical system caused by reflection light, the present invention can be applied at least to the parts that are damaged by a temperature increase.

The invention claimed is:

1. A laser apparatus, comprising:
at least one laser oscillator;
a power supply unit for supplying a driving current to the laser oscillator;
a laser optical system that includes a machining head for irradiating a workpiece serving as a laser machining subject with laser light emitted from the laser oscillator through an optical fiber;
at least one light detecting unit capable of detecting the laser light emitted from the laser oscillator and reflection light propagating in a substantially opposite direction to the laser light; and
a control unit that outputs an optical output command and a current output command corresponding to the optical output command to the power supply unit,
the laser apparatus further comprising:
a temperature calculation unit that is provided either inside the laser apparatus or outside the laser apparatus and uses a detection result acquired by the light detecting unit to calculate the temperature of at least one of respective temperature increase portions of the laser apparatus, which increase in temperature in response to the reflection light; and
an emergency command determination unit that refers to the calculated temperature of the temperature increase portion, calculated by the temperature calculation unit, and to ensure that the temperature of the temperature increase portion does not exceed a first predetermined temperature, which is an allowable upper limit temperature of the temperature increase portion and is set at a lower temperature than an upper limit heat resistance temperature of the temperature increase portion using the upper limit heat resistance temperature as a reference, determines and outputs, as required, an emergency optical output command with the aim of controlling the temperature of the temperature increase portion either to a second predetermined temperature, which is a control target temperature of the temperature increase portion and is set at a lower temperature than the first predetermined temperature, or to a lower temperature than the second predetermined temperature,
wherein, when the emergency optical output command is output, the control unit switches the optical output command output thereby to the emergency optical output command and outputs the emergency optical output command.

2. The laser apparatus according to claim 1, wherein
the temperature calculation unit calculates the temperature of one of the temperature increase portions from an energy conservation formula, in which a value acquired by subtracting a time integral of an amount of heat flowing out of the temperature increase portion from a time integral of an amount of heat flowing into the temperature increase portion matches energy that has accumulated in the temperature increase portion, or from a formula obtained by modifying the energy conservation formula.

3. The laser apparatus according to claim 2, wherein
a heat inflow amount formula, which includes the detection value acquired by the light detecting unit as a function and from which the amount of heat flowing into the temperature increase portion can be calculated, is recorded in the temperature calculation unit.

4. The laser apparatus according to any one of claim 2, wherein
a thermal resistance from the temperature increase portion to a temperature fixed point of the temperature increase portion and a thermal capacity of the temperature increase portion are recorded in the temperature calculation unit, and the temperature calculation unit calculates the temperature of the temperature increase portion using a value acquired by dividing a temperature difference, the temperature difference being acquired by subtracting a temperature at the temperature fixed point of the temperature increase portion from the temperature of the temperature increase portion, by the thermal resistance from the temperature increase portion to the temperature fixed point of the temperature increase portion as a heat outflow amount flowing out of the temperature increase portion and using a value acquired by multiplying the thermal capacity of the temperature increase portion by the temperature difference acquired by subtracting the temperature at the temperature fixed point of the temperature increase portion from the temperature of the temperature increase portion as the energy that has accumulated in the temperature increase portion.

5. The laser apparatus according to claim 4, wherein
the temperature calculation unit calculates the temperature of a linear temperature increase portion using a thermal capacity thereof per unit length and a thermal resistance thereof per unit length up to the temperature fixed point.

6. The laser apparatus according to claim 4, wherein
the temperature calculation unit is connected communicably to a first learning unit of a first machine learning device,
with respect to at least one temperature increase portion of the laser apparatus, the first learning unit learns, by machine learning, at least one of either a formula from which a physical quantity can be calculated or a physical quantity, among the heat inflow amount formula which includes the detection value acquired by the light detecting unit as a function and from which the amount of heat flowing into the temperature increase portion can be calculated, the thermal capacity of the temperature increase portion, and the thermal resistance from the temperature increase portion to the temperature fixed point, and
the temperature calculation unit calculates the temperature of the temperature increase portion by referring to a learning result acquired by the first learning unit, the learning result being obtained from the first learning unit and recorded in the temperature calculation unit.

7. The laser apparatus according to claim 6, wherein
the first machine learning device includes a first state observation unit,
at least during a learning period, the first state observation unit is connected communicably to the control unit of a learning laser apparatus that is disposed to be capable of measuring the temperature of at least one temperature increase portion using at least one temperature detecting unit and that executes the optical output command in accordance with a learning optical output command program, whereby the first state observation unit observes the detection result acquired by the light detecting unit and a measurement result indicating the temperature of the temperature increase portion, acquired by the temperature detecting unit, as state data relating to the learning laser apparatus, processes the observed state data as required so that the data can be used easily by the first learning unit, and then outputs the data to the first learning unit, and
the first learning unit learns a model relating to the regularity of the state data of the learning laser apparatus, the state data including the detection result acquired by the light detecting unit and the measurement result indicating the temperature of the temperature increase portion, acquired by the temperature detecting unit, and constructs, as a learning result, a first learning model that includes at least one of either a formula from which at least one physical quantity or physical quantity, among the amount of heat flowing into the temperature increase portion, which can be calculated as a function of the detection value acquired by the light detecting unit, the thermal capacity of the temperature increase portion, and the thermal resistance from the temperature increase portion to the temperature fixed point.

8. The laser apparatus according to claim 1, wherein
the temperature calculation unit calculates the temperature of the temperature increase portion as a general solution of a differential equation obtained by time-differentiating an energy conservation formula in which the value acquired by subtracting the time integral of the amount of heat flowing out of the temperature increase portion from the time integral of the amount of heat flowing into the temperature increase portion matches the energy that has accumulated in the temperature increase portion.

9. The laser apparatus according to claim 1,
comprising a plurality of the light detecting unit,
wherein an amount of reflection light propagating through a core of the optical fiber and an amount of reflection light propagating through cladding of the optical fiber can be detected separately from detection results acquired by the plurality of light detecting unit.

10. The laser apparatus according to claim 1,
comprising a plurality of the light detecting unit,
wherein at least one of the plurality of light detecting unit has a different response wavelength characteristic to the other light detecting unit.

11. The laser apparatus according to claim 1, wherein
the emergency command determination unit determines the emergency optical output command on the basis of a control method for feedback-controlling light output relative to the temperature of the temperature increase portion, or to the temperature of the temperature increase portion and a transition thereof, using the calculated temperature of the temperature increase portion, calculated by the temperature calculation unit, as input data.

12. The laser apparatus according to claim 1, wherein
the emergency command determination unit predicts a transition of the temperature of the temperature increase portion following a certain point in time from at least calculated temperatures of the temperature increase portion calculated by the temperature calculation unit at and up to the certain point in time and either the optical output command that is currently being output by the control unit or the optical output command that is about to be output by the control unit, and determines the emergency optical output command by referring to the predicted transition of the temperature of the temperature increase portion.

13. The laser apparatus according to claim 12, wherein
a second machine learning device having a second state observation unit, a label acquisition unit, and a second learning unit is connected communicably to the control unit,
the second state observation unit observes state data expressing the state of the laser apparatus, including the optical output command, processes the observed state data as required so that the data can be used easily by the second learning unit, and then outputs the data to the second learning unit as input data,
the label acquisition unit acquires, as a label, time series data corresponding to the input data and relating to the calculated temperature of the temperature increase portion, calculated by the temperature calculation unit, and outputs an acquisition result to the second learning unit,
the second learning unit includes an error calculation unit that calculates an error in the label relative to the input data on the basis of a second learning model constructed in order to represent the label from the input data, and a learning model updating unit that updates the second learning model in accordance with the error, and
the emergency command determination unit predicts the transition of the calculated temperature of the temperature increase portion with respect to the optical output command from the control unit by referring to a learning result learned by the second learning unit by repeatedly updating the second learning model, and determines and outputs the emergency optical output command as required so as to ensure that the temperature of the temperature increase portion does not exceed the second predetermined temperature.

14. The laser apparatus according to claim 12, wherein a third machine learning device having a third state observation unit, a determination data acquisition unit, a third learning unit, and a decision-making unit is connected communicably to the control unit, the third learning unit includes a reward calculation unit and a value function updating unit, the third state observation unit observes state data expressing the state of the laser apparatus and including time series data relating to the optical output command up to a certain point in time and the calculated temperature of the temperature increase portion up to the certain point in time, processes the observed state data as required so that the data can be used easily by the third learning unit, and then outputs the data to the third learning unit as input data, the decision-making unit refers to a learning result acquired by the third learning unit, and after predicting that the calculated temperature of the temperature increase portion will exceed the second predetermined temperature if the optical output command continues to be executed after the certain point in time, determines an optical output command by which it is estimated that the calculated temperature of the temperature increase portion following the certain point in time will be controlled to the second predetermined temperature, and outputs the determined optical output command to the control unit of the laser apparatus, the determination data acquisition unit acquires a difference between the calculated temperature of the temperature increase portion, the calculated temperature being the result of the optical output command determined and output by the decision-making unit, and the second predetermined temperature, as determination data, and outputs the acquired determination data to the reward calculation unit, the reward calculation unit calculates either a positive reward or a negative reward in response to the determination data, the value function updating unit updates a value function on the basis of the calculated reward, and at a time outside a period in which the laser apparatus is used for learning, the emergency command determination unit of the laser apparatus predicts the transition of the calculated temperature of the temperature increase portion with respect to the optical output command from the control unit by referring to the value function, which serves as a learning result acquired by the third learning unit by repeatedly updating the value function, and determines and outputs the emergency optical output command as required so as to ensure that the temperature of the temperature increase portion does not exceed the second predetermined temperature.

15. The laser apparatus according to claim 1, wherein light output of the laser light is stopped immediately when the calculated temperature of the temperature increase portion, calculated by the temperature calculation unit in relation to the temperature increase portion, reaches the first predetermined temperature or the temperature of the temperature increase portion exceeds the first predetermined temperature.

16. The laser apparatus according to claim 1, wherein the laser apparatus is connected to a network together with the temperature calculation unit and shares the temperature calculation unit with a plurality of laser apparatuses within the same cell, the plurality of laser apparatuses also being connected to the network.

* * * * *